US012563815B2

(12) United States Patent
Chen et al.

(10) Patent No.: US 12,563,815 B2
(45) Date of Patent: Feb. 24, 2026

(54) SEMICONDUCTOR STRUCTURE HAVING FIRST SILICIDE FEATURES AND SECOND SILICIDE FEATURES AND METHOD FOR MANUFACTURING THE SAME

(71) Applicant: Taiwan Semiconductor Manufacturing Company, Ltd., Hsinchu (TW)

(72) Inventors: Chun-Yuan Chen, HsinChu (TW); Lo-Heng Chang, Hsinchu (TW); Huan-Chieh Su, Changhua County (TW); Chih-Hao Wang, Hsinchu County (TW); Szu-Chien Wu, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 395 days.

(21) Appl. No.: 18/308,912

(22) Filed: Apr. 28, 2023

(65) Prior Publication Data
US 2024/0363684 A1     Oct. 31, 2024

(51) Int. Cl.
*H10D 84/01*     (2025.01)
*H10D 30/01*     (2025.01)
(Continued)

(52) U.S. Cl.
CPC ......... *H10D 84/013* (2025.01); *H10D 30/014* (2025.01); *H10D 30/43* (2025.01);
(Continued)

(58) Field of Classification Search
CPC ................. H10D 30/01; H10D 30/014; H10D 30/019–0198; H10D 30/0212; H10D 30/0273; H10D 30/43; H10D 30/435; H10D 30/501–509; H10D 30/6729; H10D 30/674; H10D 30/6757; H10D 30/797; H10D 62/121; H10D 62/151; H10D 62/822; H10D 62/83; H10D 64/017; H10D 84/01; H10D 84/0128; H10D 84/013; H10D 84/038; H10D 84/83; H10D 84/8311; H10D 84/8312; H10D 84/83125;
(Continued)

(56) References Cited

U.S. PATENT DOCUMENTS 9,209,247 B2    12/2015  Colinge et al.
9,236,267 B2     1/2016  De et al.
(Continued)

*Primary Examiner* — Cheung Lee
(74) *Attorney, Agent, or Firm* — McClure, Qualey & Rodack, LLP

(57)     ABSTRACT
A method for manufacturing a semiconductor structure includes forming first and second fins over a substrate. The fin includes first and second semiconductor layers alternating stacked. The method further includes forming a dummy gate structure over the first and second fins, forming first source/drain features on opposite sides of the dummy gate structures and over the first fin, forming second source/drain features on opposite sides of the dummy gate structures and over the second fin, forming a dielectric layer over and between the first and second source/drain features, replacing the dummy gate structure and the first semiconductor layers with a gate structure wrapping around the first semiconductor layers, forming first silicide features over the first source/drain features, and forming second silicide features over the second source/drain features.

20 Claims, 55 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/03* | (2025.01) |
| *H10D 84/83* | (2025.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 64/017* (2025.01); *H10D 84/0128* (2025.01); *H10D 84/038* (2025.01); *H10D 84/83* (2025.01)

(58) Field of Classification Search
CPC ....... H10D 84/83135; H10D 84/83138; H10D 84/8314; H10D 84/8316; H10D 84/832–833; H10D 84/835; H10D 84/836; H10D 84/837–839; H10D 30/6735
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |

110
108
106
108
106

102

100

108
106
108
106

112C

112B

112A

100

202

102

102C

102B

102A

Z
X Y

100

502A    502B    502C 102A    102B    102C

202

102

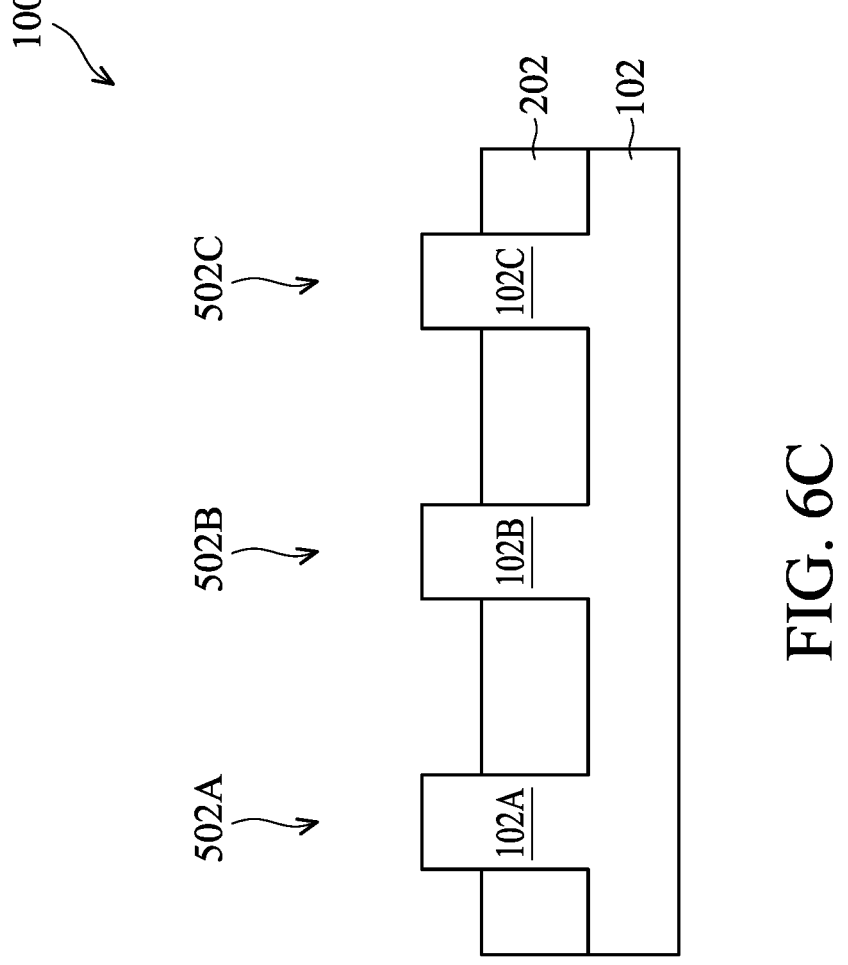
100
502A  502B  502C
102A  102B  102C
202
102
FIG. 6C
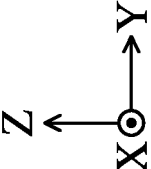
Z
X  Y

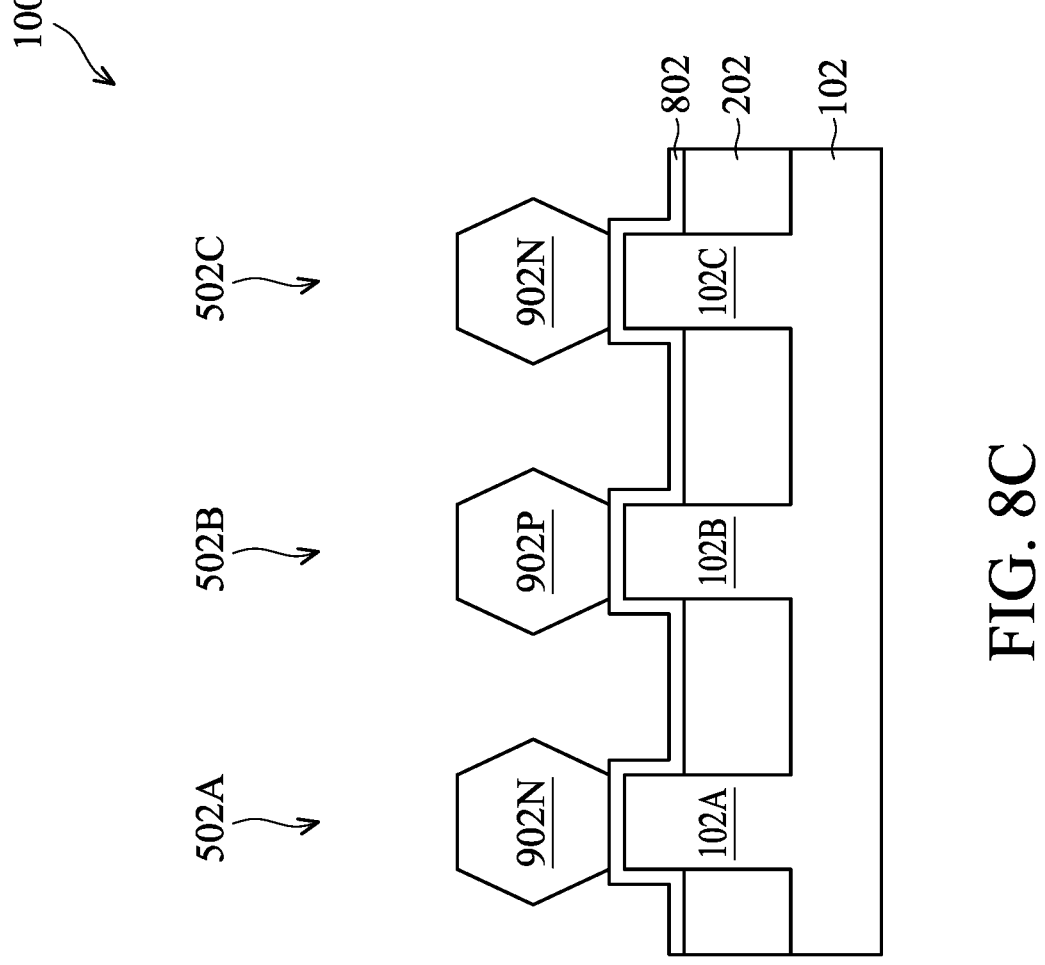
100
502C 502B 502A
902N 902P 902N
802 202 102
102C 102B 102A
FIG. 8C
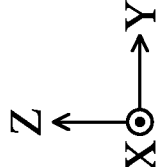
Z
X Y

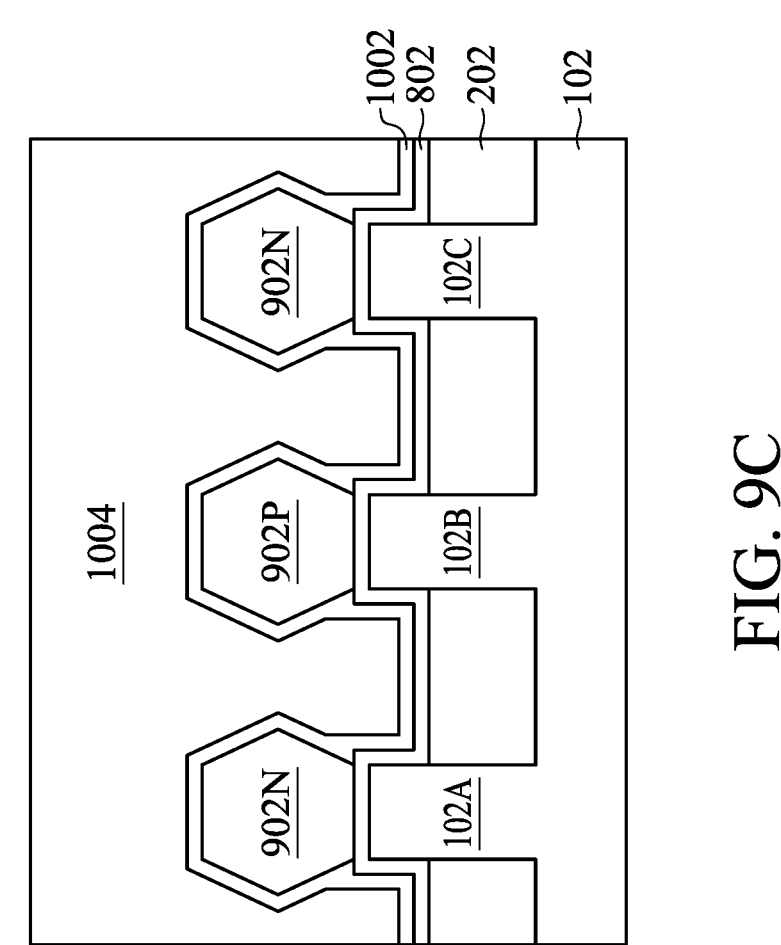
FIG. 9C
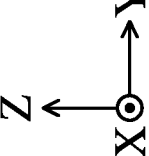

100

1002
802
202
102

902N
902P
902N

1004

102A
102B
102C

100

1002
802
202
102

902N
902P
902N

1004

102C
102B
102A

Z
X
Y

100

C'

1202-2

1004

B'

1002

902N

802

102C

202

102

102B

A'

902P

902N 1202-1

1406

B

A

1404

1402

402

1206

1204

902N

108

102

102A

C

Z

Y

X

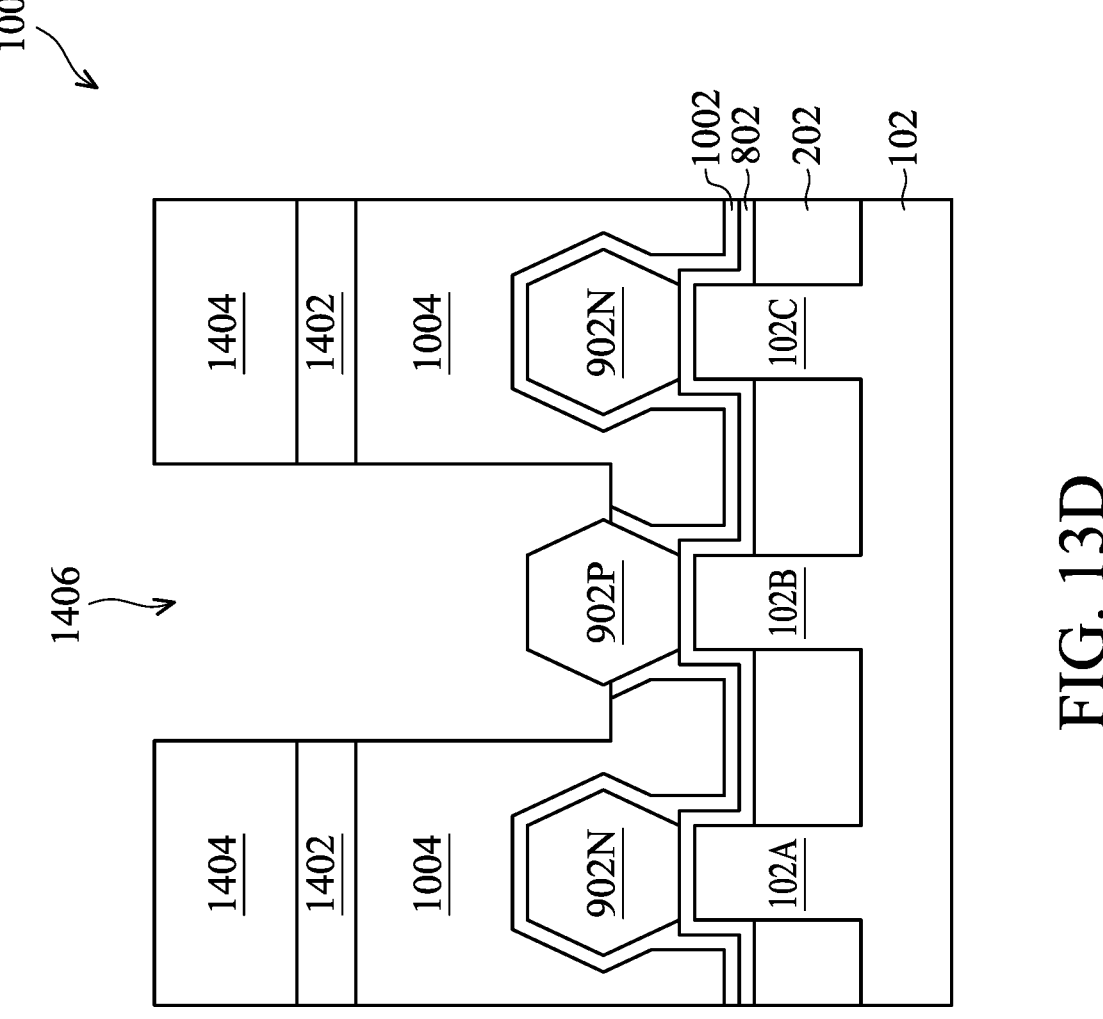
FIG. 13D
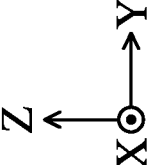

100

1402

1004

902N

1406

1502
1502h
1502a

1502a

902P

1402

1004

902N 1002
802
202
102

102A

102B

102C

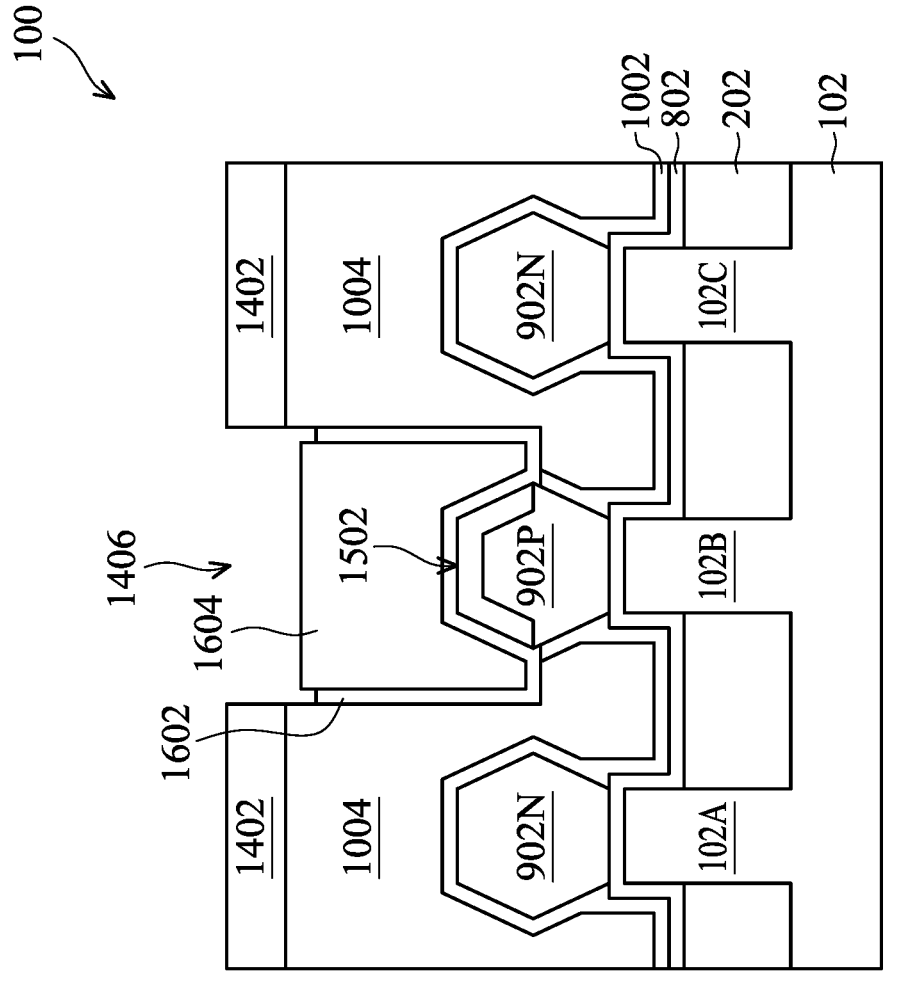
FIG. 16D
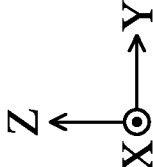

100

1202-2

1202-1

B

C'

1702

1602

B'

902N

1002

1002

1604

902P
902N 402
1206
1204

902N

108

102

A

A'

802

1002

1004

102C

202

102

1502

102B

102A

C

C

Z
Y
X 100
1004
1002
802
202
102
1702    1502    1702
902N    902P    902N
102A    102B    102C
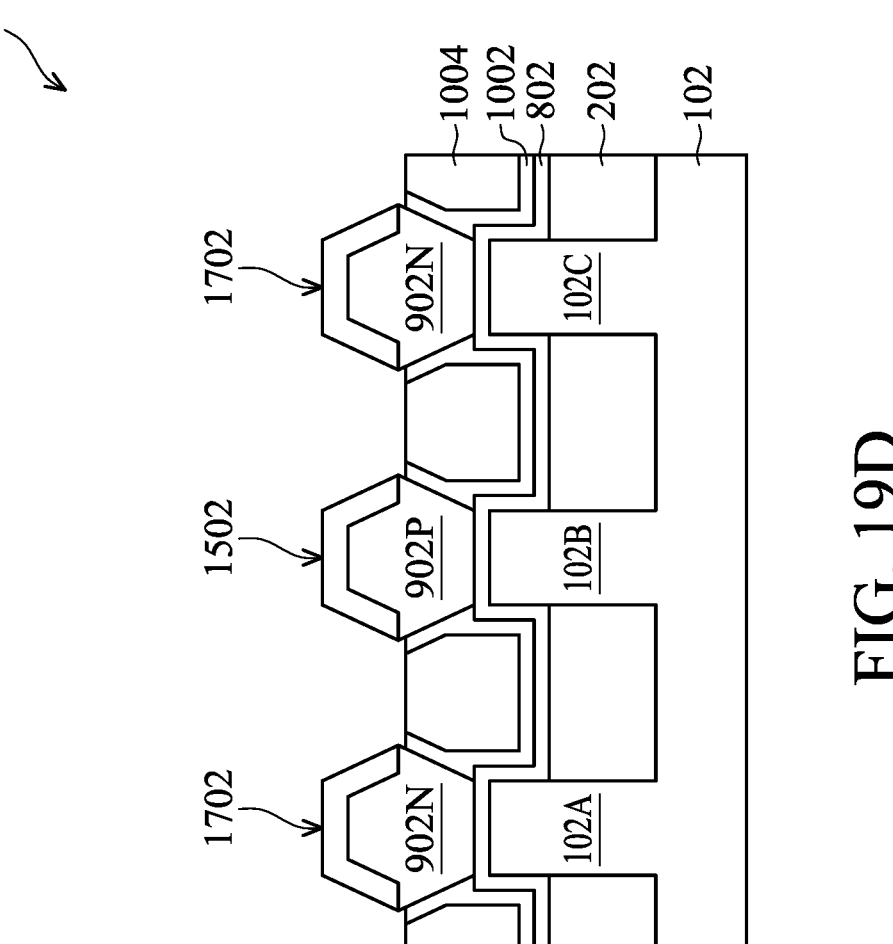
FIG. 19D
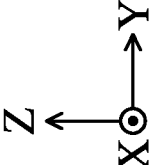
Z
X
Y

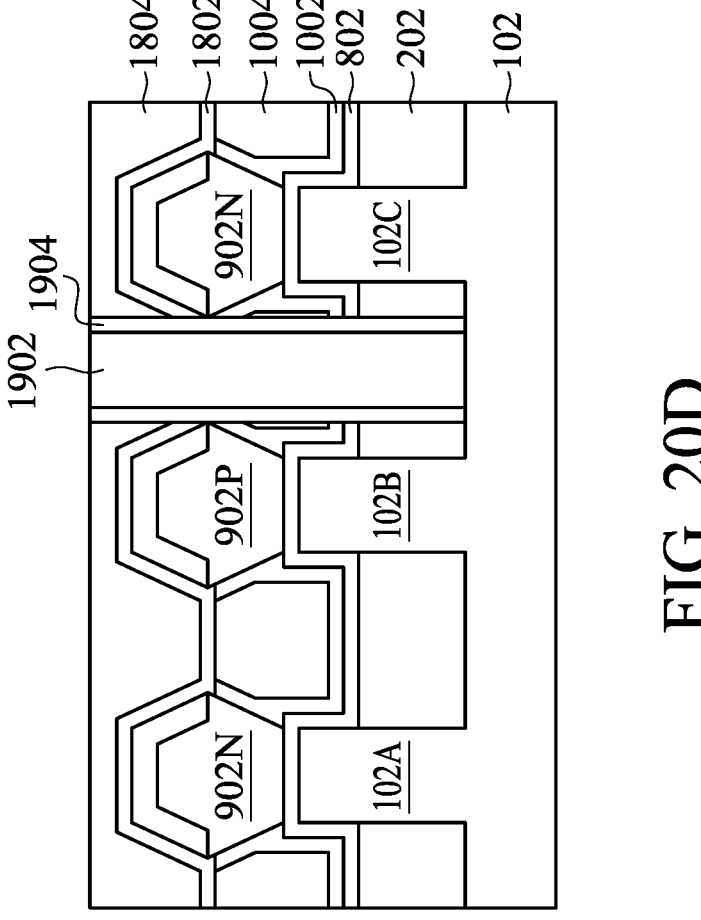
1804
1802
1004
1002
802
202
102
1902 1904
902N
902P
902N
102C
102B
102A
FIG. 20D
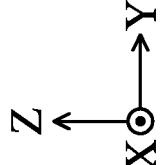
Z
X
Y

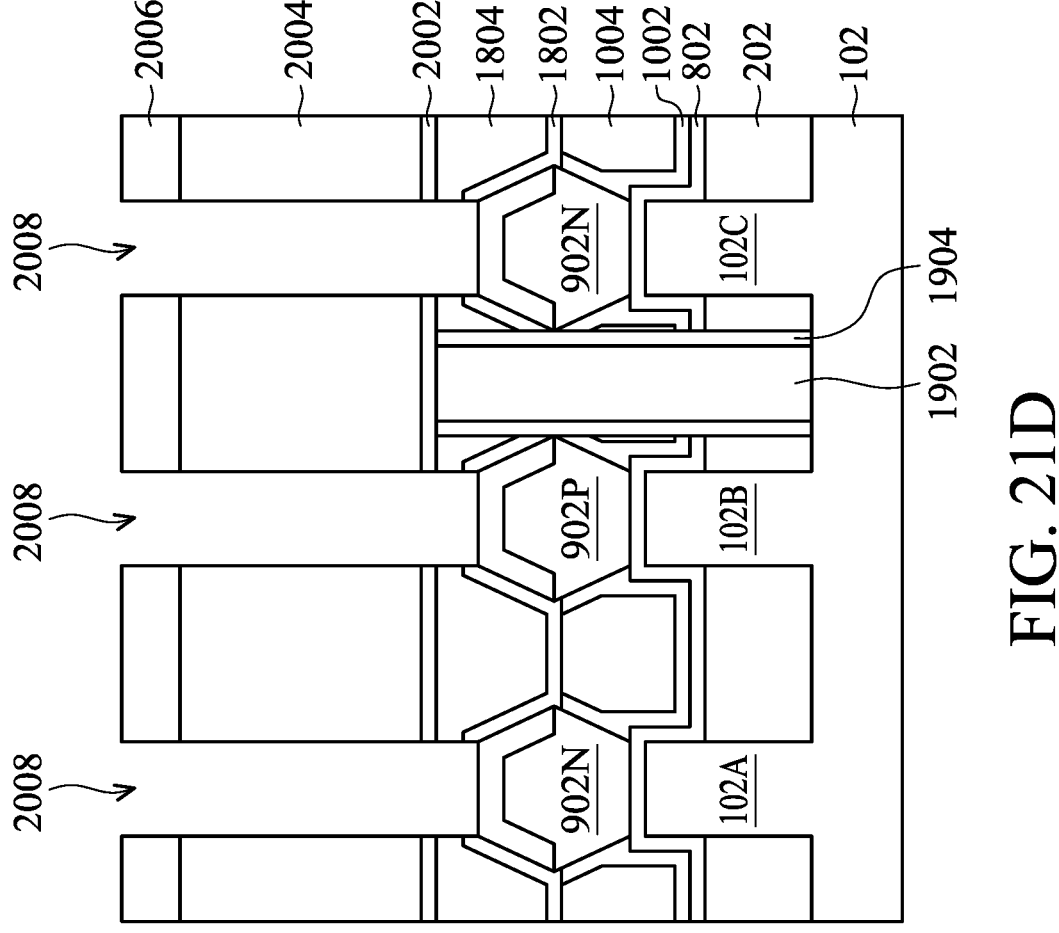
2006
2004
2002
1804
1802
1004
1002
802
202
102
2008
2008
2008
902N
902P
902N
102C
102B
102A
1904
1902
FIG. 21D
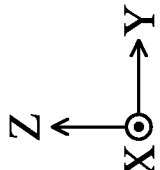

2102

2004

B

A 2102
1702
902N
108

102
1202-1

1202-2

C'

2004
2002
1804
1802
1702
1902
902N 802
102C
202
1904
102

1502
102B

1002

902P
1004
1004

B'

A'
902N

C

X
Y
Z

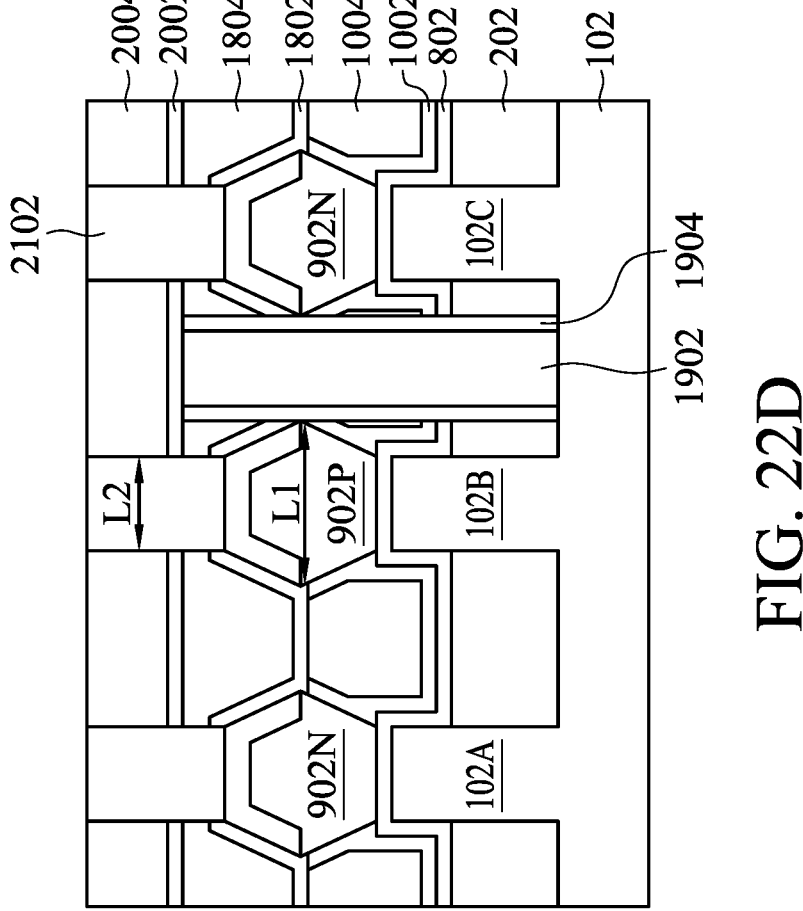
FIG. 22D
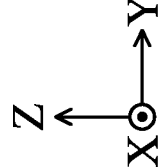

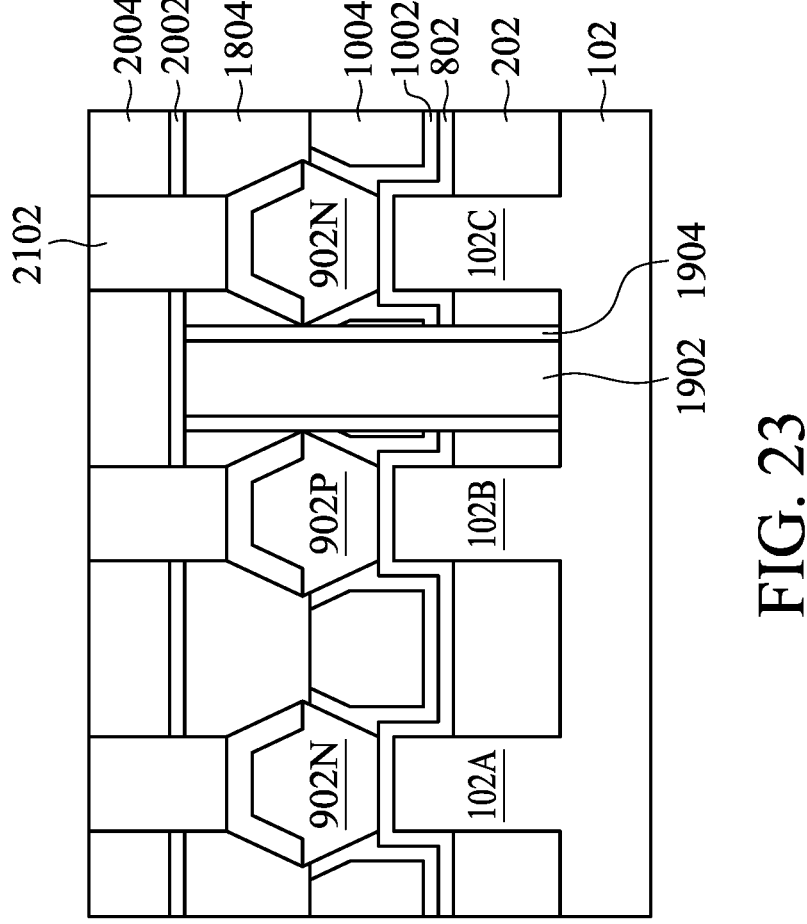
FIG. 23
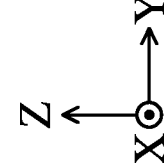

SEMICONDUCTOR STRUCTURE HAVING FIRST SILICIDE FEATURES AND SECOND SILICIDE FEATURES AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, as GAA transistors and circuit cells continue to be scaled down, the existing contact features used for source/drain features impact the isolation margin as well as the cost. Accordingly, although existing technologies for fabricating circuit cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3C, 4C, 5C, 6C, 7C, 8C, 9C, and 10C are Y-Z cross-sectional views of the portion of the workpiece at various fabrication stages along a line C-C' of FIG. 2, in accordance with some embodiments of the present disclosure.

FIGS. 11D, 12D, 13D, 14D, 15D, 16D, 17D, 18D, 19D, 20D, 21D, and 22D are Y-Z cross-sectional views of the portion of the workpiece at various fabrication stages along lines C-C' of FIGS. 2 and 11A to 22A, in accordance with some embodiments of the present disclosure.

FIG. 23 is a Y-Z cross-sectional view of the portion of the workpiece along the line C-C' of FIG. 22A, in accordance with some embodiments of the present disclosure.

DETAILED DESCRIPTION

Figure 1:
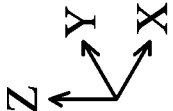
FIGS. 1 and 2 are perspective views of a portion of a workpiece at various fabrication stages, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications. While existing technologies for fabricating GAA transistors have been generally adequate for their intended applications, they have not been entirely satisfactory in all aspects.

The nanostructure transistor (e.g. nanosheet transistor, nanowire transistor, multi-bridge channel, nano-ribbon FET, gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including silicide features having different compositions for n-type and p-type source/drain features. Furthermore, the silicide features are formed before the formation of contact openings for source/drain contacts to increase the process window and contact area, thereby reducing or decreasing resistance. The details of the structure and manufacturing methods of the present disclosure are described below in conjunction with the accompanying drawings, which illustrate the process of making GAA transistors, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise excepted.

Figure 2:
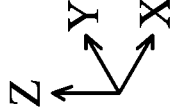

FIGS. 1 and 2 are perspective views of a portion of a workpiece 100 at various fabrication stages, in accordance with some embodiments of the present disclosure. Referring to FIG. 1, a workpiece 100 is provided. As shown in FIG. 1, the workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. In some embodiments, n-type wells have an n-type dopant concentration of about $5\times10^{16}$ cm$^{-3}$ to about $5\times10^{19}$ cm$^{-3}$, and p-type wells have a p-type dopant concentration of about $5\times10^{16}$ cm$^{-3}$ to about $5\times10^{19}$ cm$^{-3}$. Because the workpiece 100 will be fabricated into a semiconductor structure 100 upon conclusion of the fabrication processes, the workpiece 100 may be referred to as the semiconductor structure 100 as the context requires.

The stack 104 includes semiconductor layers 106 and 108, and the semiconductor layers 106 and 108 are alternatingly stacked in the Z-direction. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers. In some embodiments, the semiconductor layers 106 and 108 are epitaxially grown over (on) the substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), plasma-enhanced CVD (PECVD), a combination thereof, or the like, may also be utilized. The semiconductor layers 106 and the semiconductor layers 108 are deposited alternatingly, one-after-another, to form the stack 104. It should be noted that two (2) layers of the semiconductor layers 106 and two (2) layers of the semiconductor layers 108 are alternately and vertically arranged (or stacked) as shown in FIG. 1, which are for illustrative purposes only and not intended to be limiting beyond what is specifically recited in the claims. The number of layers depends on the desired number of channels members for the semiconductor device. In some embodiments, there may be from 2 to 6 semiconductor layers 106 alternating with 2 to 6 semiconductor layers 108 in the stack 104.

For patterning purposes, the workpiece 100 may also include a hard mask layer 110 over the stack 104. The hard mask layer 110 may be a single layer or a multi-layer. In some embodiments, the hard mask layer 110 is a single layer and includes a silicon germanium layer. In some embodiments, the hard mask layer 110 is a multi-layer and includes a silicon nitride layer and a silicon oxide layer over the silicon nitride layer. In some other embodiments, the hard mask layer 110 is a multi-layer and includes a silicon germanium layer and a silicon layer over the silicon germanium layer.

Referring to FIG. 2, the substrate 102, the stack 104, and the hard mask layer 110 are then patterned to form fins 112A, 112B, and 112C (may be collectively referred to as fins 112) over the substrate 102 in the Z-direction. As shown in FIG. 2, each of the fins 112 includes a base fin (102A, 102B, and 102C) formed from a portion of the substrate 102 and a stack portion formed from the stack 104 over the base portion. In some aspects, the base fins 102A, 102B, and 102C protrude from the substrate 102. Each of the fins 112 extends lengthwise in the X-direction and extends vertically in the Z-direction over the substrate 102, and arranged in the Y-direction. In some embodiments, widths of the fins 112 along the Y-direction are the same. Although the three fins 102A, 102B, and 102C are formed and shown herein, more fins may be formed, such as four or more fins.

The fins 112 may be patterned using suitable processes including double-patterning or multi-patterning processes. For example, in some embodiments, a material layer is formed over a substrate and patterned using a photolithography process. Spacers are formed alongside the patterned material layer using a self-aligned process. The material layer is then removed, and the remaining spacers, or mandrels, may then be used to pattern the fins 112 by etching the stack 104 and the substrate 102. The etching process may include dry etching, wet etching, reactive ion etching (RIE), and/or other suitable processes.

FIGS. 3A to 10A are X-Z cross-sectional views of the portion of the workpiece 100 at various fabrication stages along a line A-A' of FIG. 2, in accordance with some embodiments of the present disclosure. FIGS. 3B to 10B are X-Z cross-sectional views of the portion of the workpiece 100 at various fabrication stages along a line B-B' of FIG. 2, in accordance with some embodiments of the present disclosure. FIGS. 3C to 10C are Y-Z cross-sectional views of the portion of the workpiece 100 at various fabrication stages along a line C-C' of FIG. 2, in accordance with some embodiments of the present disclosure.

Figure 3B:
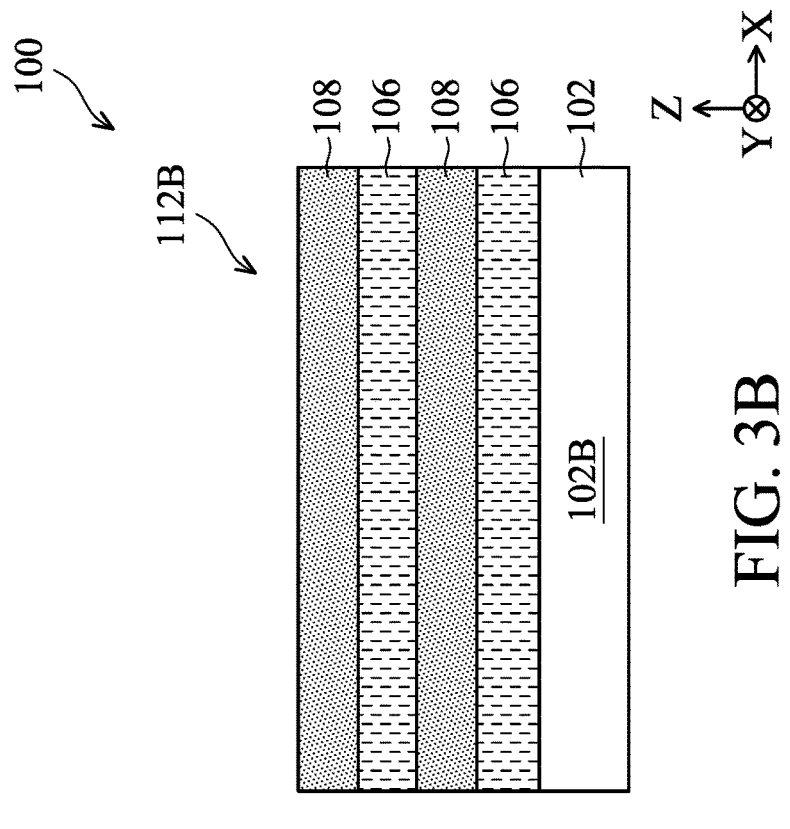
FIGS. 3B, 4B, 5B, 6B, 7B, 8B, 9B, and 10B are X-Z cross-sectional views of the portion of the workpiece at various fabrication stages along a line B-B' of FIG. 2, in accordance with some embodiments of the present disclosure.
Figure 3A:
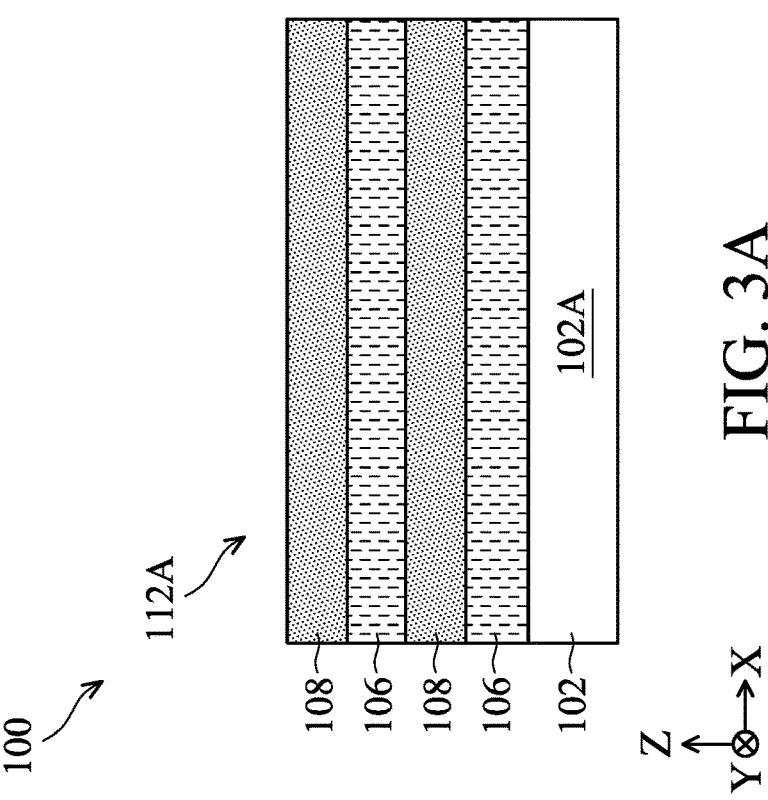
FIGS. 3A, 4A, 5A, 6A, 7A, 8A, 9A, and 10A are X-Z cross-sectional views of the portion of the workpiece at various fabrication stages along a line A-A' of FIG. 2, in accordance with some embodiments of the present disclosure.
Figure 3C:
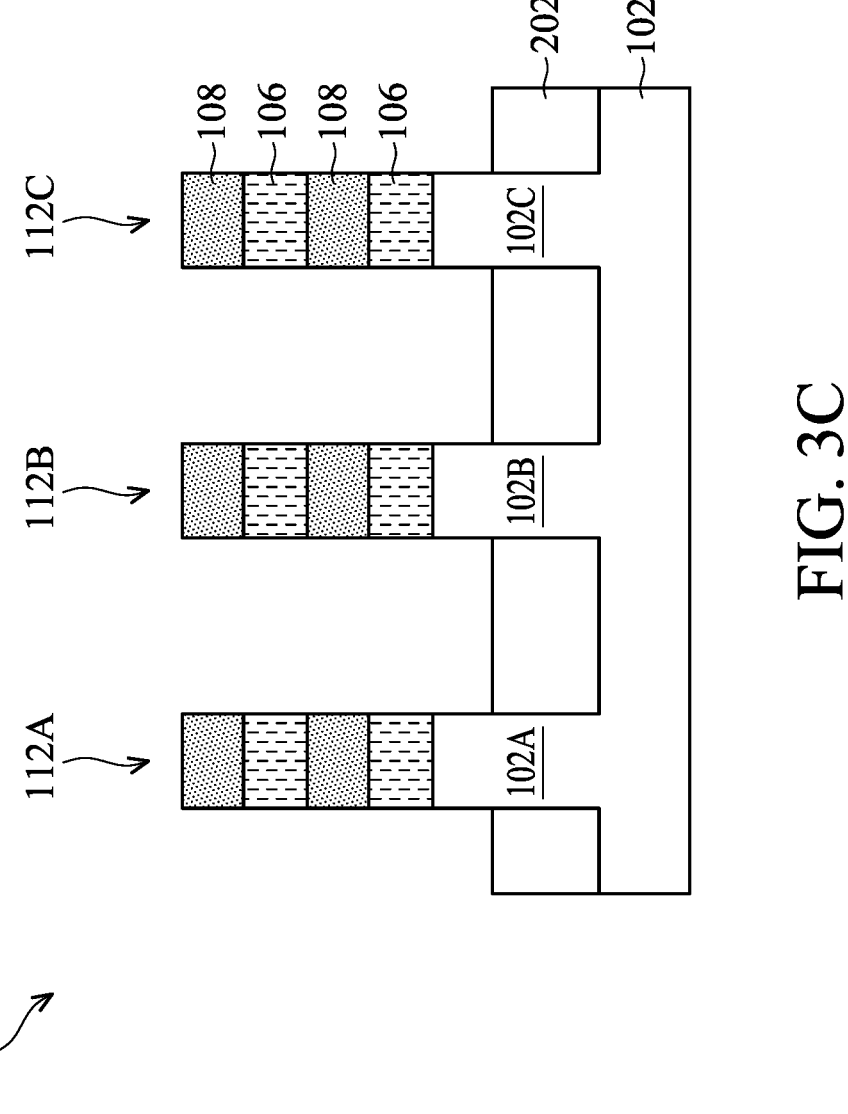

Referring to FIGS. 3A to 3C, an isolation structure 202 is formed. After the fins 112 are formed, the hard mask layer 110 over the fins 112 is removed and the isolation structure 202 is formed over the substrate 102. In some embodiments, the isolation structure 202 is formed between the fins 112. In some other aspects, the isolation structure 202 is formed around the fins 112. More specifically, the isolation structure 202 is formed between and around the base fins (e.g., 102A, 102B, and 102C) of the fins 112. The isolation structure 202 may also be referred to as shallow trench isolation (STI) feature. In some embodiments, a dielectric material for the isolation structure 202 is first deposited over the workpiece 100. Specifically, the dielectric material is deposited and formed over the fins 112 and the substrate 102 to cover the fins 112 and the substrate 102. In some aspects, the dielectric material is formed to wrap around the fins 112. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD, a subatmospheric CVD (SACVD), a flowable CVD (FCVD), an ALD, spin-on coating, and/or other suitable process. The deposited dielectric material is then thinned and planarized, for example by a chemical mechanical polishing (CMP) process, until top surfaces of the hard mask layer 110 is exposed (not shown). The planarized dielectric material is further recessed by a dry etching process, a wet etching process, and/or a combination thereof to form the isolation structure 202. As shown in FIG. 1C, the stack portions of the fins 112 rise above the isolation structures 202 while the base fins 102A, 102B, and 102C are surrounded by the isolation structures 202. In other words, top surfaces (or topmost surfaces) of the substrate 102 are higher than top surfaces of the isolation structure 202. In some embodiments, before the formation of the isolation structure 202, a liner layer may be conformally deposited over the substrate 202 using ALD or CVD.

Figures 4A, 4B:
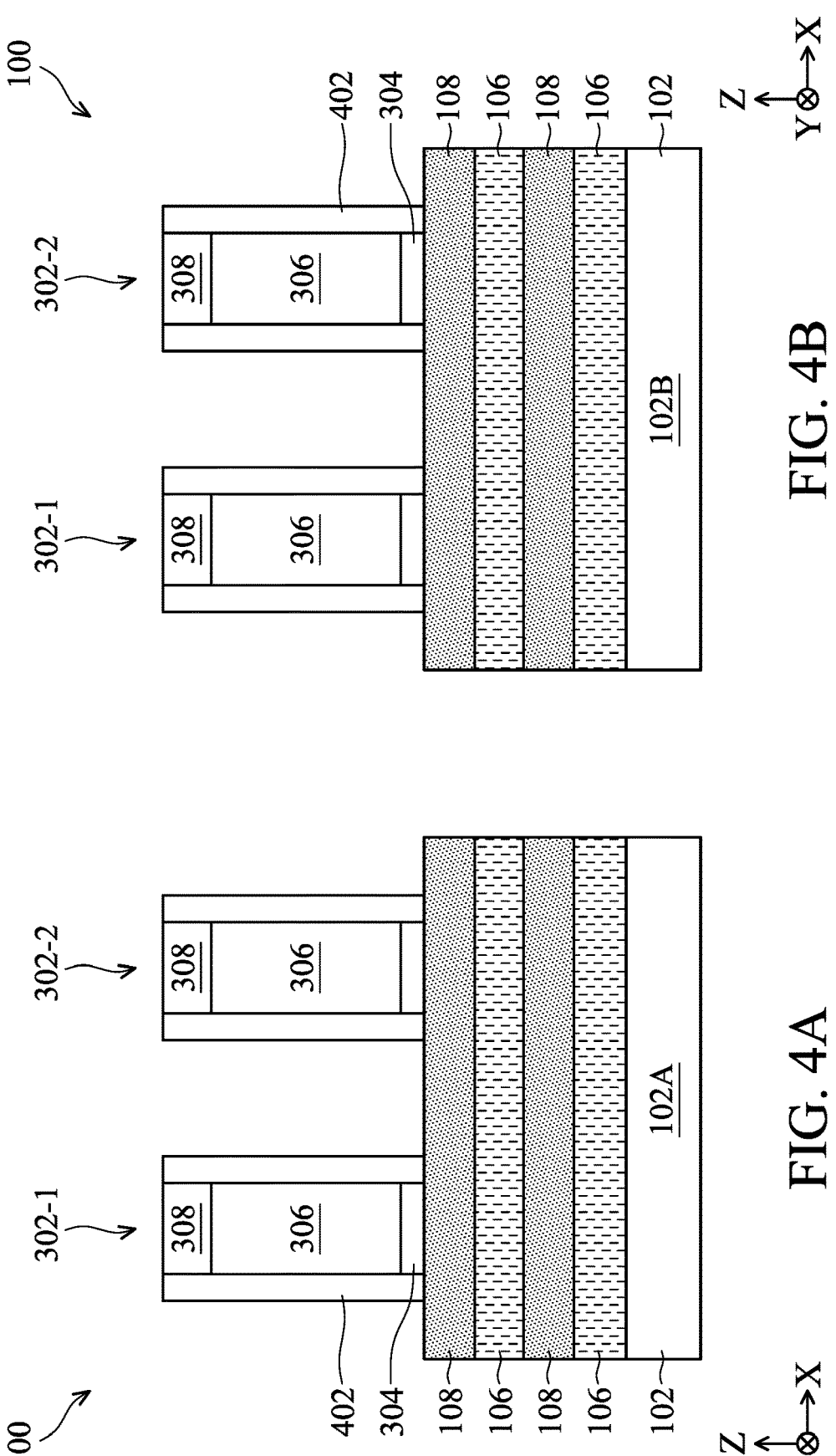
Figure 4C:
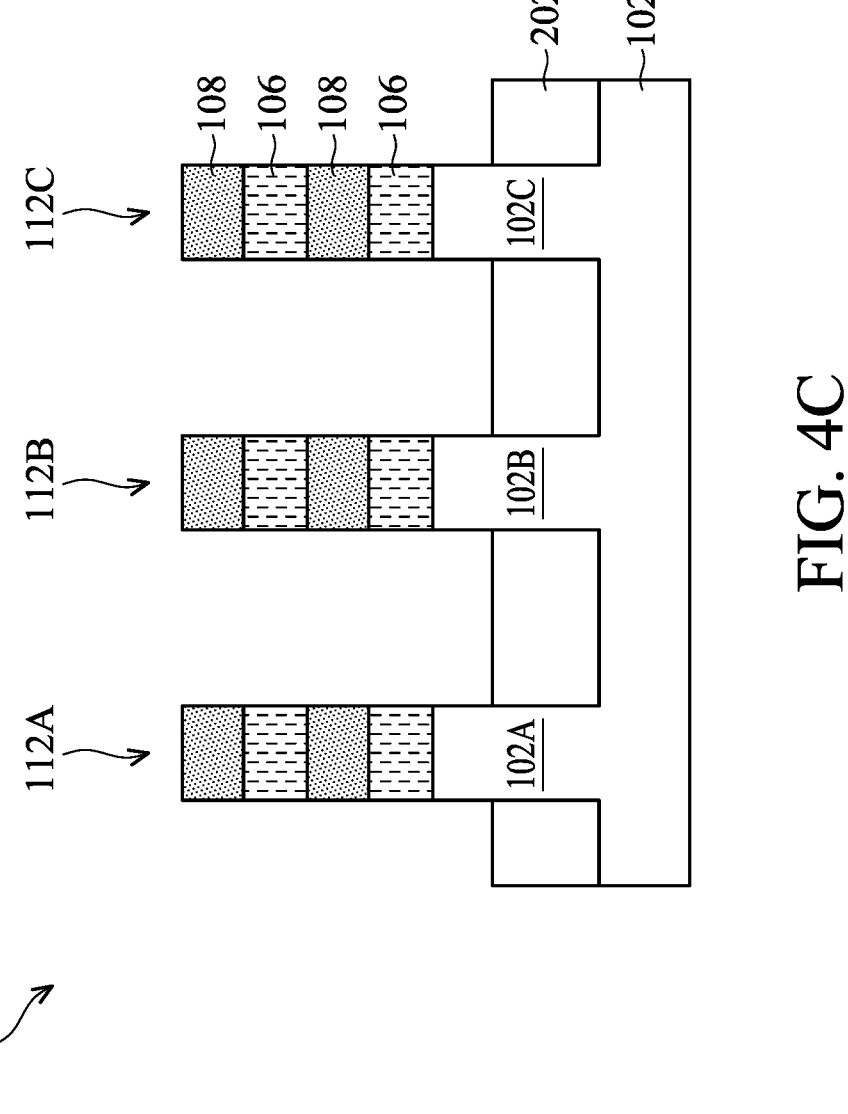
Figure 4C:
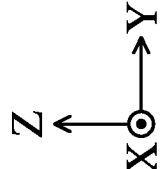

Referring to FIGS. 4A to 4C, dummy gate structures 302-1 and 302-2 (may be collectively referred to as dummy gate structures 302) may be formed over the fins 112 and over the isolation structure 202. The dummy gate structures 302 may be configured to extend lengthwise in the Y-direction and wrap around top surfaces and side surfaces of the fins 112. In some embodiments, to form the dummy gate structures 302, a dummy interfacial material for dummy interfacial layers 304 is first formed over fins 112 and over the isolation structure 202. More specifically, the dummy interfacial material is conformally formed on the sidewalls of the fins 112 (not shown) and over the top surfaces of the fins 112 and the isolation structure 202 (not shown). In some embodiments, the dummy interfacial layer 304 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 306 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., physical vapor deposition (PVD), CVD, PECVD, and ALD).

Then, hard mask layers 308 are formed over the dummy gate material. In some embodiments, the hard mask layers 308 may be formed using photolithography and removal (e.g., etching) processes. In some embodiments, the hard mask layers 308 may include photoresist materials or hard mask materials. In some embodiments, each of the hard mask layers 308 may include multiple layers, such as a silicon nitride layer and a silicon oxide layer. After the formation of the hard mask layers 308, a removal process (e.g., etching) may be performed to remove portions of the dummy gate material for the dummy gate electrodes 306 and the dummy interfacial material for the dummy interfacial layers 304 that do not directly underlie the hard mask layers 308, thereby forming the dummy gate structures 302 each having the dummy interfacial layer 304, the dummy gate electrode 306, and the hard mask layer 308. The dummy interfacial layers 304 may also be referred to as dummy gate dielectrics. The dummy gate structures 302 may undergo a gate replacement process through subsequent processing to form metal gates, such as a high-k metal gate, as discussed in greater detail below.

FIGS. 4A and 4B shows two dummy gate structures 302-1 and 302-2. In some embodiments, less or more dummy gate structures may be formed for one or more transistors sharing source/drain regions. In other embodiments, some dummy gate structures may also undergo a gate replacement process to form dielectric based gates that electrically isolate transistors formed by the dummy gate structure 302 from neighboring transistors or devices.

Still referring to FIGS. 4A to 4C, after the formation of the dummy gate structures 302, gate spacers 402 are formed on sidewalls of the dummy gate structures 302 and over the top surfaces of the fins 112. More specifically, the gate spacers 402 are formed on opposite the sidewalls of the dummy gate structures 302, as shown in FIGS. 4A and 4B. The gate spacers 402 may include silicon nitride ($Si_3N_4$), silicon oxide ($SiO_2$), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof. The gate spacers 402 may include a single layer or a multi-layer structure. In some embodiments, the gate spacers 402 may be formed by conformally depositing a spacer layer (containing the dielectric material) over the isolation structure 202, the fins 112, and dummy gate structures 302, followed by an anisotropic etching process to remove top portions of the spacer layer from the top surfaces of the isolation structure 202, the fins 112, and dummy gate structures 302. After the etching process, portions of the spacer layer on the sidewall surfaces of the dummy gate structures 302 substantially remain and become the gate spacers 402. In some embodiments, the anisotropic etching process is a dry (e.g., plasma) etching process. Additionally or alternatively, the formation of the gate spacers 402 may also involve chemical oxidation, thermal oxidation, ALD, CVD, and/or other suitable methods. The gate spacers 402 may also be interchangeably referred to as top spacers.

Figures 5A, 5B:
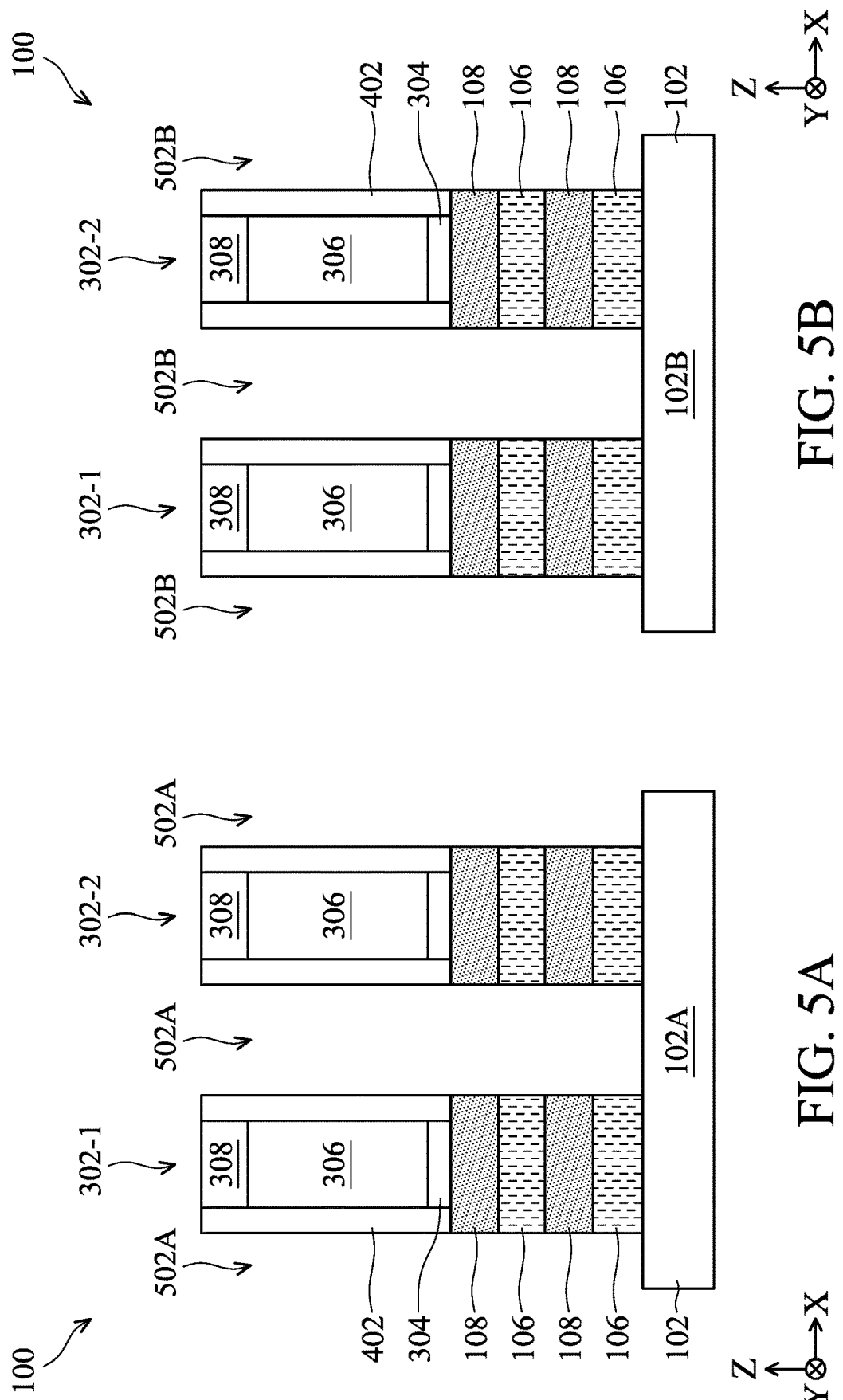
Figure 5C:
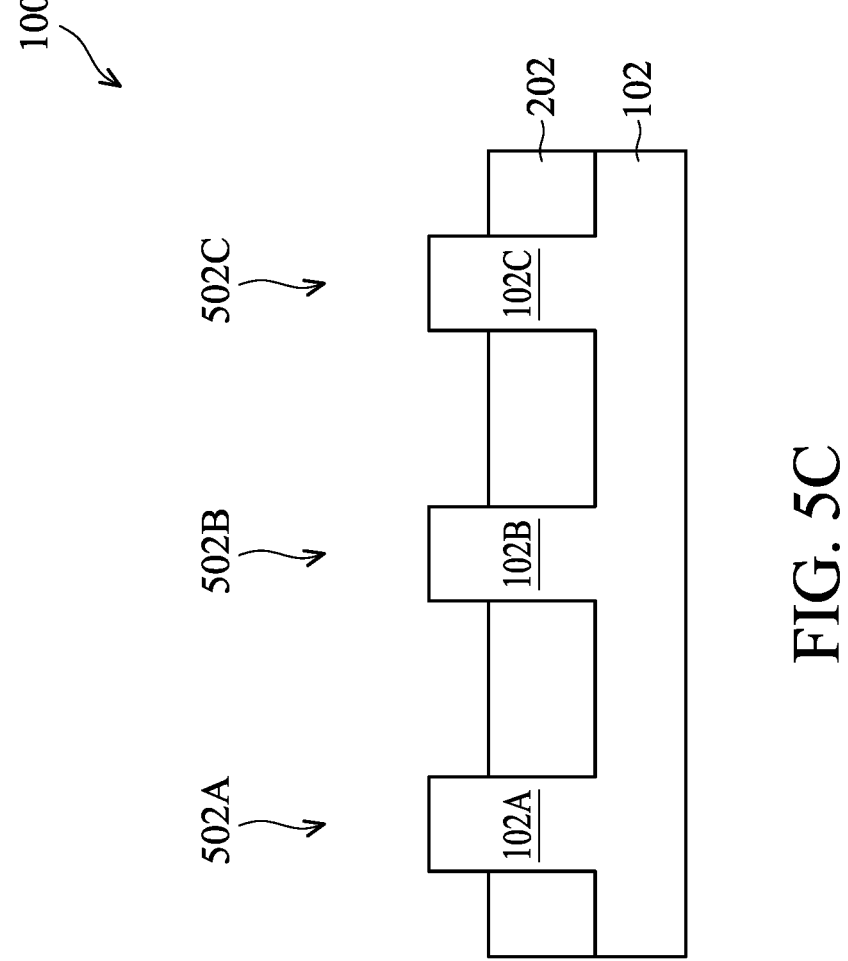
Figure 5C:
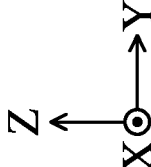

Referring to FIGS. 5A to 5C, the fins 112A, 112B, and 112C are recessed to form source/drain trenches 502A, 502B, and 502C (may be collectively referred to as source/drain trenches 502) in the fin 112 (or passing through the semiconductor layers 106 and 108). Specifically, the source/drain trenches 502 may be formed by performing one or more etching processes to remove portions of the semiconductor layers 106, the semiconductor layers 108 that do not vertically overlap or be covered by the dummy gate structures 302 and the gate spacers 402. In some embodiments, a single etchant may be used to remove the semiconductor layers 106, the semiconductor layers 108, and the substrate 102, whereas in other embodiments, multiple etchants may be used to perform the etching process. After the recessing, sidewalls of the semiconductor layers 106 and 108 that vertically overlap or be covered by the dummy gate structure 302 and the gate spacers 402 are exposed in the source/drain trenches 502, as shown in FIGS. 5A and 5B. Furthermore, as shown in FIGS. 5A to 5C, the source/drain trenches 502A, 502B, and 502C also expose top surfaces of the substrate 102 (more specifically, top surfaces of the base fins 102A, 102B, and 102C of the substrate 102). In some embodiments, the exposed top surfaces of the substrate 102 are substantially level with the bottom surfaces of the bottommost semiconductor layers 106 (i.e., substantially coplanar). In other embodiments, portions of the substrate 102 are removed during the recessing of the fins 112, and then the exposed top surfaces of the substrate 102 are lower than the bottom surfaces of the bottommost semiconductor layers 106. Furthermore, in some embodiments, the exposed top surfaces of the substrate 102 are concave. In other words, after the recessing of the fins 112, the substrate 102 has concave top surfaces exposed in the source/drain trenches 502A, 502B, and 502C. Although not shown in FIGS. 5A and 5B, top portions of the hard mask layer 310 and the gate spacers 402 on the sidewalls of the dummy gate structure 302 are removed, lowering the height of the dummy gate structure 302 (the hard mask layer 310) and the height of the gate spacers 402, in accordance with some embodiments of the present disclosure.

Figures 6A, 6B:
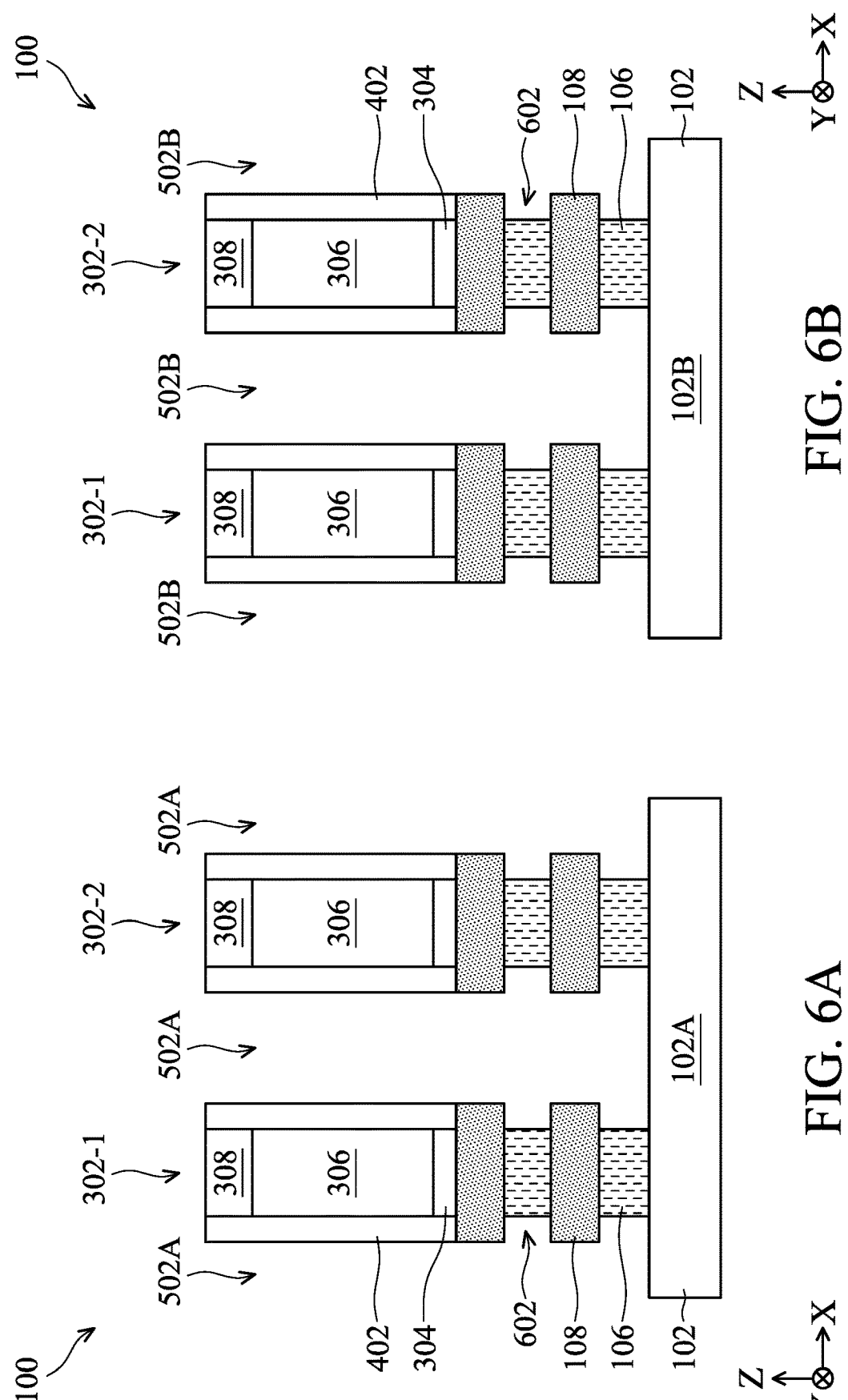

Referring to FIGS. 6A to 6C, side portions of the semiconductor layers 106 are removed via a selective etching process. Specifically, the selective etching process is performed that selectively etches the side portions of the semiconductor layers 106 below the gate spacers 402 through the source/drain trenches 502A, 502B, and 502C, with minimal (or no) etching of semiconductor layers 108, such that gaps 602 are formed vertically between the semiconductor layers 108 in the Z-direction as well as vertically between the semiconductor layers 108 and the substrate 102 in the Z-direction, and below the gate spacers 402. The etching process is configured to laterally etch (e.g., along the X-direction) the semiconductor layers 106 below the gate spacers 710. The selective etching process is a dry etching process, a wet etching process, other suitable etching process, or combinations thereof.

Figures 7A, 7B:
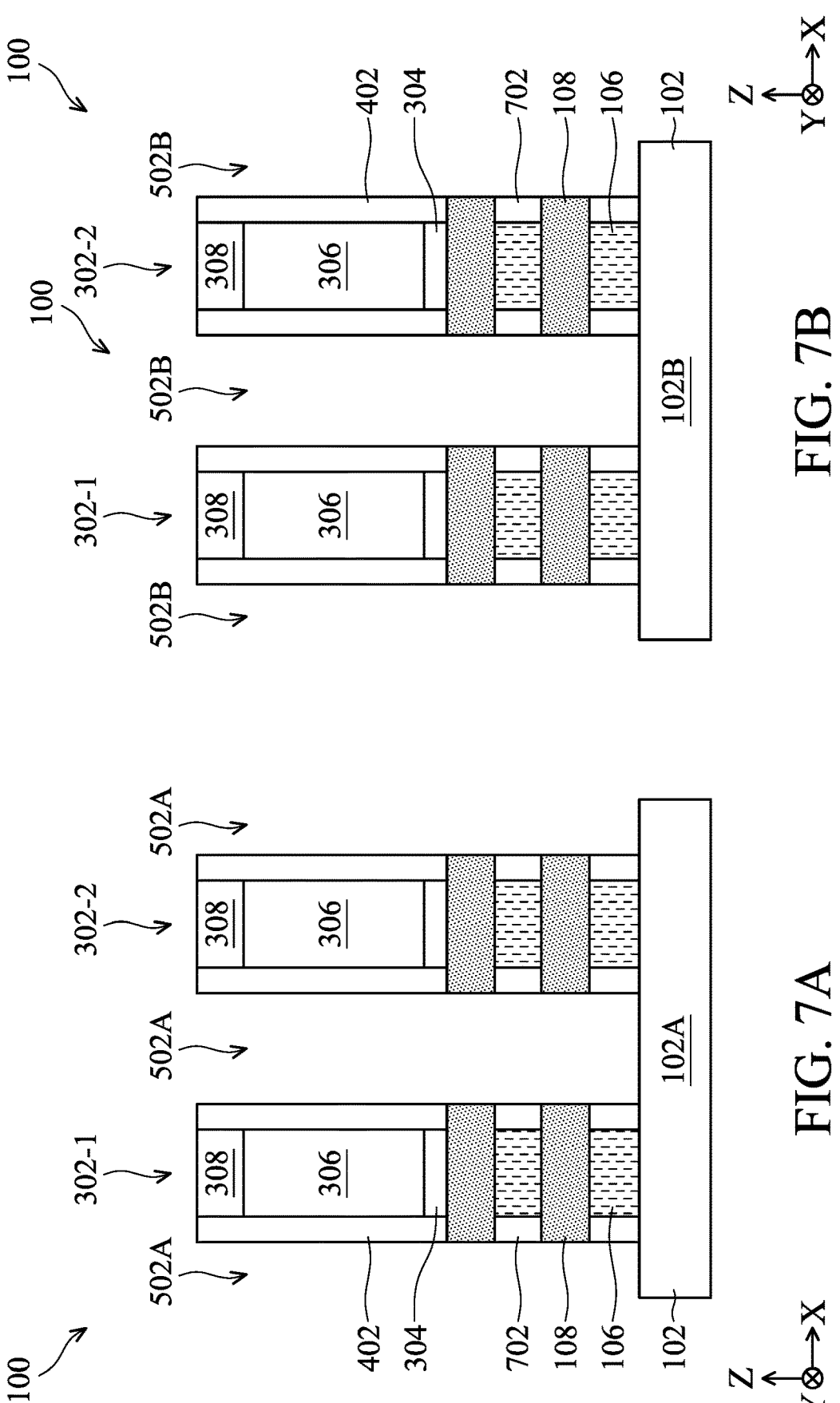
Figure 7C:
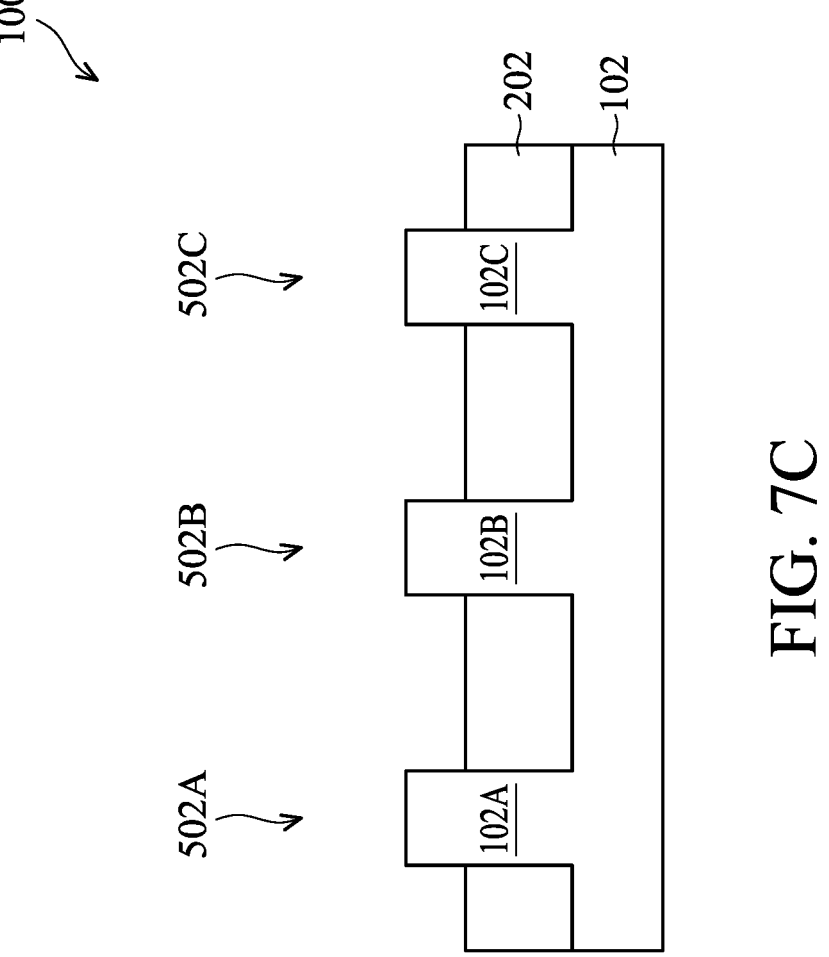
Figure 7C:
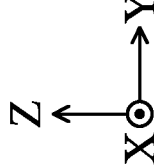

Referring to FIGS. 7A to 7C, inner spacers 702 are formed to fill the gaps 602. In some embodiments, sidewalls of the inner spacers 702 are aligned to the sidewalls of the gate spacers 402 and the semiconductor layers 108, as shown in FIGS. 7A and 7B. In order to form the inner spacers 702, a deposition process forms a spacer layer into the source/drain trenches 502A, 502B, and 502C and the gaps 602, such as CVD, PVD, ALD, HDPCVD, MOCVD, RPCVD, PECVD, LPCVD, atomic layer CVD (ALCVD), atmospheric pressure CVD (APCVD), other suitable methods, or combinations thereof. The spacer layer partially (or, in some embodiments, completely) fills the source/drain trenches 502A, 502B, and 502C. The deposition process is configured to ensure that the spacer layer fills the gaps 602 vertically between the semiconductor layers 108 in the Z-direction as well as vertically between the semiconductor layer 108 and the substrate 102 in the Z-direction, and below the gate spacers 402. An etching process is then performed that selectively etches the spacer layer to form inner spacers 702 (as shown in FIGS. 7A and 7B) with minimal (to no) etching of the semiconductor layer 108, the substrate 102, the dummy gate structure 302, and the gate spacers 402. The spacer layer (and thus inner spacers 702) includes a material that is different than a material of the semiconductor layers 108 and a material of the gate spacers 402 to achieve desired etching selectivity during the etching process. In some embodiments, the inner spacers 702 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacers 702 include a low-k dielectric material, such as those described herein.

Figures 8A, 8B:
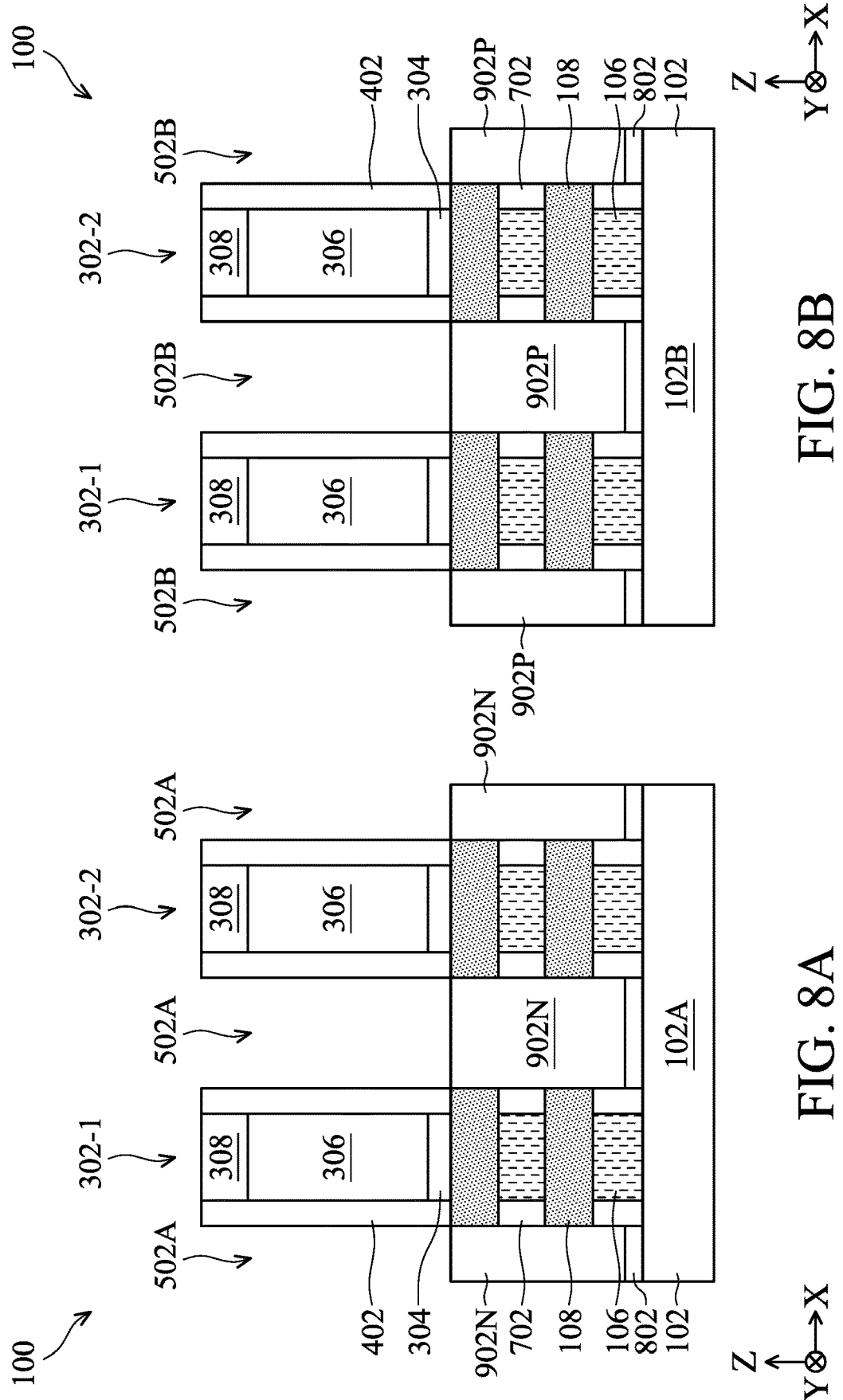

Referring to FIGS. 8A to 8C, a dielectric layer 802 is formed over the isolation structure 202 and the substrate 102 in the source/drain trenches 502. In some embodiment, the dielectric layer 802 is in contact with the sidewalls of the inner spacers 702, in the X-Z cross-sectional view, as shown in FIGS. 8A and 8B. In some aspect, the dielectric layer 802 is in contact with and between the inner spacers 702, in the X-Z cross-sectional view. In order to form the dielectric layer 802, a dielectric material is conformally formed over isolation structure 202, the substrate 102, the gate spacers 402, and the dummy gate structure 302, and on sidewalls of the substrate 102, the gate spacers 402, the inner spacers 702, and the semiconductor layers 108 by a deposition process, such as CVD, PVD, ALD, HDPCVD, MOCVD, RPCVD, PECVD, LPCVD, ALCVD, APCVD, other suitable methods, or combinations thereof. An etching process is then performed that etches portions of the dielectric material over the gate spacers 402 and the dummy gate structure 302, and on the sidewalls of the gate spacers 402, the inner spacers 702, and the semiconductor layers 108 to form the dielectric layers 802 over the substrate 102 and the isolation structure 202, as shown in FIGS. 1J-1 and 1J-2. In some embodiments, the dielectric material may include silicon nitride ($Si_3N_4$), silicon oxide ($SiO_2$), silicon carbide (SiC), silicon oxycarbide (SiOC), silicon oxynitride (SiON), silicon carbon nitride (SiCN), silicon oxycarbon nitride (SiOCN), other suitable material(s), or combinations thereof.

Still referring to FIGS. 8A to 8C, after the formation of the dielectric layer 802, source/drain features 902N and 902P are formed in the source/drain trenches 502A, 502B, and 502C. More specifically, the source/drain features 902N and 902P are formed over the dielectric layer 902 over the base fins 102A, 102B, and 102C of the substrate 102 in the source/drain trenches 502A, 502B, and 502C. As shown in FIGS. 8A to 8C, source/drain features 902N are respectively formed in the source/drain trenches 502A and 502C and source/drain features 902P are formed in the source/drain trenches 502B. In some embodiments, the source/drain features 902P are formed between the source/drain features 902N in the Y-direction. The source/drain features 902N and 902P are also formed on opposite sides of the dummy gate structures 302 in the X-direction. For example, the source/drain features 902N are formed on opposite sides of the dummy gate structures 302-1 and 302-2, as shown in FIG. 8A, and the source/drain features 902P are also formed on opposite sides of the dummy gate structures 302-1 and 302-2, as shown in FIG. 8B.

The source/drain features 902N and 902P are attached and connected to the semiconductor layers 108 in the X-direction. In some aspects, the semiconductor layers 108 serve as channels to connect one source/drain feature 902N/902P to another source/drain feature 902N/902P. Therefore, the semiconductor layers 108 may also be referred to as channels, channel layers, or channel members. As shown in FIG. 8C, in the Y-Z cross-sectional view, the source/drain features 902N and 902P has a hexagon-like shape. In some embodiments, the top surfaces of the source/drain features 902N and 902P are substantially level with the top surfaces of the topmost semiconductor layers 108 (i.e., substantially coplanar), as shown in FIGS. 8A and 8B. In other embodiments, the source/drain features 902N and 902P may have top surfaces that extend higher than top surfaces of the topmost semiconductor layers 108 (e.g., in the Z-direction).

It should be noted that the source/drain features 902N and 902P are separated from the substrate 102 (more specifically, the base fins 102A, 102B, and 102C) by the dielectric layer 802. As such, it prevents the leakage current of the resultant transistors from one source/drain feature 902N/902P to another source/drain feature 902N/902P through the substrate 102 (more specifically, the base fins 102A, 102B, and 102C), thereby improving performances of the resultant transistors.

One or more epitaxy processes may be employed to grow the source/drain features 902N and 902P. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 902N and 902P are grown from the semiconductor layers 108 rather than the substrate 102 due to the dielectric layer 902 cover the top surfaces of the substrate 102.

The source/drain features 902N may include any suitable semiconductor materials. For example, the source/drain features 902N used for n-type GAA transistors may include epitaxially-grown material selected from a group consisting of silicon phosphide (SiP), silicon carbide (SiC), silicon phosphoric carbide (SiPC), silicon arsenide (SiAs), silicon (Si), or a combination thereof. In some embodiments, the epitaxially-grown material of the source/drain features 902N may be doped with n-type dopants (such as phosphorus, arsenic, other n-type dopant, or combinations thereof) having a doping concentration in a range from about $2 \times 10^{19}/$cm$^3$ to $3 \times 10^{21}/$cm$^3$. The source/drain features 902N may also be referred to as source/drain, or source/drain regions. In some embodiments, source/drain feature(s) 902N may refer to a source or a drain, individually or collectively dependent upon the context. In some embodiments, the source/drain features 902N may be referred to as n-type source/drain features. The source/drain features 902N may be doped in-situ or ex-situ. One or more annealing processes may be performed to activate the dopants in the source/drain features 902N. The annealing processes may include rapid thermal annealing (RTA) and/or laser annealing processes.

The source/drain features 902P may include any suitable semiconductor materials. For example, the source/drain features 902P used for p-type GAA transistor may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 902P may be doped with p-type dopants (such as boron, indium, other p-type dopant, or combinations thereof) having a doping concentration in a range from about $1 \times 10^{19}/$cm$^3$ to $6 \times 10^{20}/$cm$^3$. The source/drain features 902P may also be referred to as source/drains, or source/drain regions. In some embodiments, source/drain features 902P may refer to a source or a drain, individually or collectively dependent upon the context. In some embodiments, the source/drain features 902P may be referred to as p-type source/drain features. The source/drain features 902P may be doped in-situ or ex-situ. One or more annealing processes may be performed to activate the dopants in the source/drain features 902P. The annealing processes may include rapid thermal annealing (RTA) and/or laser annealing processes.

Figures 9A, 9B:
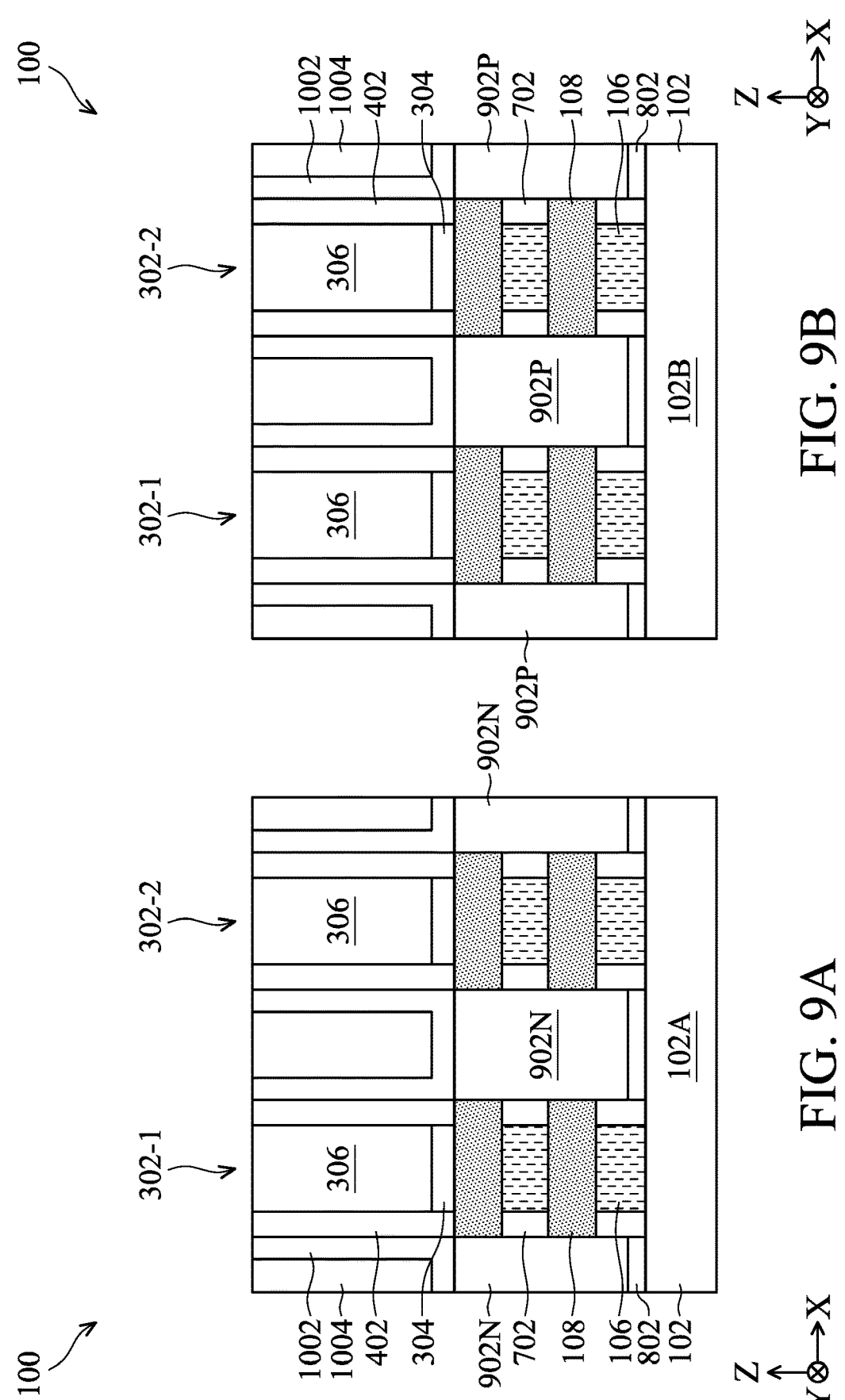

Referring to FIGS. 9A to 9C, an etch stop layer (ESL) 1002 over the source/drain features 902N and 902P and an dielectric layer 1004 over the ESL 1002 are formed to fill the space between the gate spacers 402 and in the source/drain trenches 502A, 502B, and 502C. Specifically, the ESL 1002 is conformally formed on the sidewalls of the gate spacers 402 and the source/drain features 902N and 902P, over the top surfaces of the source/drain features 902N and 902P and the top surfaces of the dielectric layer 802, as shown in FIGS. FIGS. 9A to 9C. The dielectric layer 1004 is then formed over the ESL 1002 to fill a remaining space between (or inside) the ESL 1002, between the gate spacers 402 and in the source/drain trenches 502A, 502B, and 502C. In some embodiments, the dielectric layer 1004 is formed between the source/drain features 902N and 902P, as shown in FIG. 9C. In some embodiments, the dielectric layer 1004 is coated to cover the source/drain features 902N and 902P. The ESL 1002 includes a material that is different than the dielectric layer 1004. The ESL 1002 includes silicon nitride (Si$_3$N$_4$). In some embodiments, the ESL 1002 may include La$_2$O$_3$, Al$_2$O$_3$, SiOCN, SiOC, SiCN, SiO$_2$, SiC, ZnO, ZrN, Zr$_2$Al$_3$O$_9$, TiO$_2$, TaO$_2$, ZrO$_2$, HfO$_2$, Si$_3$N$_4$, Y$_2$O$_3$, AlON, TaCN, ZrSi, or other suitable material(s); and may be formed by CVD, PVD, ALD, or other suitable methods. The dielectric layer 1004 may include SiOC. In some embodiments, the dielectric layer 1004 may include a material containing compositions of Si, O, C, and/or N, such as SiC, SiOC, SiON, SiCN, SiOCN, or other suitable material. The dielectric layer 1004 may be formed by spin-on coating process. In some embodiments, the dielectric layer 1004 may be formed by PECVD (plasma-enhanced CVD), FCVD (flowable CVD), or other suitable methods. Subsequent to the deposition of the ESL 1002 and the dielectric layer 1004, a CMP process and/or other planarization process is performed on the ESL 1002, the dielectric layer 1004, the gate spacers 402, and the hard mask layers 308 until the top surfaces of the dummy gate electrodes 306 are exposed. In some embodiments, portions of the dummy gate electrodes 306 are removed after the planarization process. Furthermore, the dielectric layer 1004 is surrounded by the ESL 1002, as shown in FIGS. 9A and 9B.

Figures 10A, 10B:
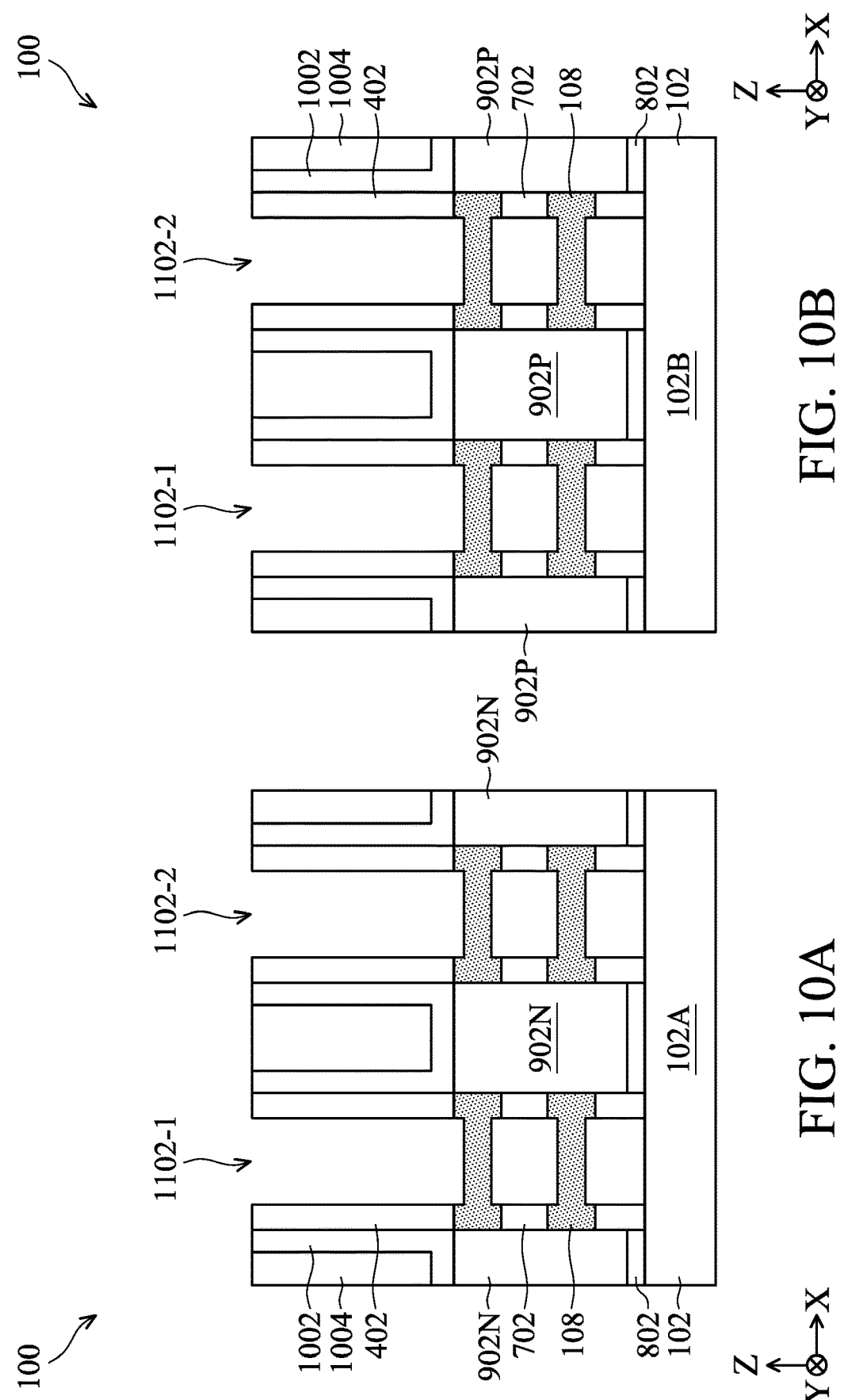
Figure 10C:
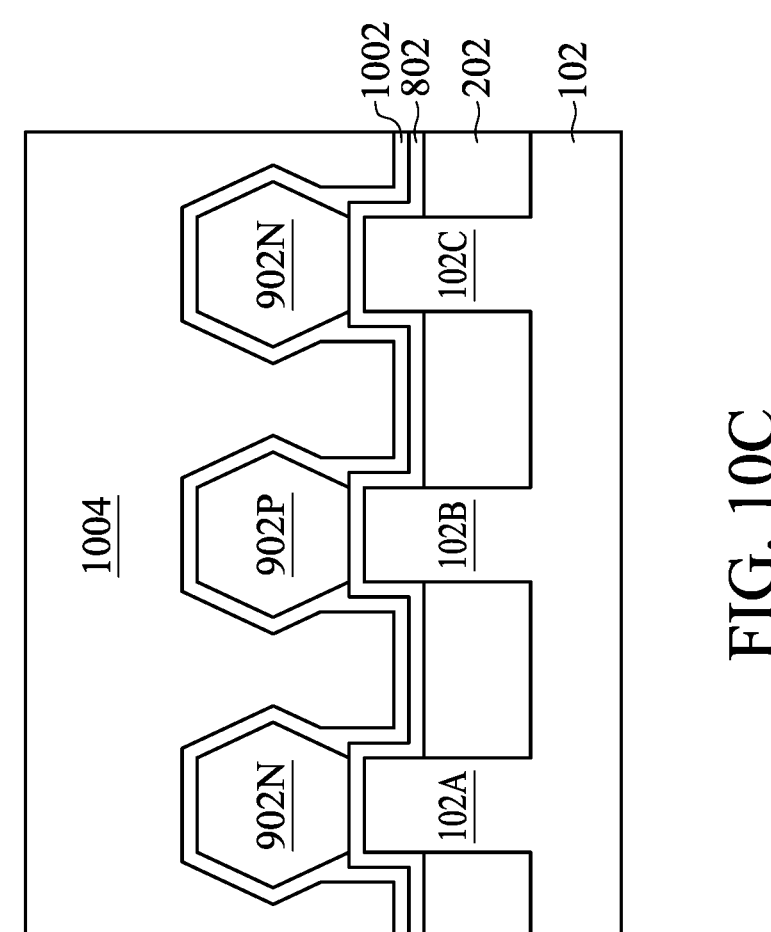
Figure 10C:
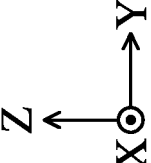

Referring to FIGS. 10A to 10C, the dummy gate structures 302 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 302. Then, the dummy gate structures 302 are selectively etched through the masking element. The gate spacers 402 may be used as the masking element or a part thereof. Etch selectivity may be achieved by selecting the appropriate etching chemicals, and the dummy gate structures 302 may be removed without substantially affecting the ESL 1002 and the dielectric layer 1004. The removal of the dummy gate structures 302 forms gate trenches 1102-1 and 1102-2 (may be collectively referred to as gate trenches 1102). The gate trenches 1102 expose the top surfaces of the topmost semiconductor layers 108 that underlies the dummy gate structures 302.

Still referring to FIGS. 10A to 10C, the semiconductor layers 106 of the fins 112 are selectively removed through the gate trenches 1102, using a wet or dry etching process for example, so that the semiconductor layers 108 and are exposed in the gate trench 1102 to form nanostructures stacked over each other, which serving as channels, channel layers, or channel members for resultant transistors. As such, the semiconductor layers 108 may be referred to as nanostructures, channels, channel layers, or channel members. Specifically, the semiconductor layers 108 are stacked vertically in the Z-direction. Such a process may also be referred to as a wire release process, a nanowire release process, a nanosheet release process, a nanowire formation process, a nanosheet formation process, or a wire formation process. In some embodiments, the removal of the semiconductor layers 106 causes the exposed semiconductor layers 108A or 108B to be spaced apart from each other in the vertical direction (e.g., in the Z-direction). The exposed semiconductor layers 108 extend longitudinally in the horizontal direction (e.g., in the X-direction). Furthermore, each of the semiconductor layers 108 connects one source/drain feature 902N/902P to another source/drain feature 902N/902P. Furthermore, as shown in FIGS. 10A and 10B, portions of the semiconductor layers 108 exposed in the gate trenches 1102 are removed during the removal of the semiconductor layers 106. More specifically, middle portions of the semiconductor layers 108 exposed in the gate trenches 1102 are partially removed during the removal of the semiconductor layers 106. As such, each of the semiconductor layers 108 shown in the X-Z cross-sectional views of the FIGS. 10A and 10B has a dumbbell-like shape.

FIGS. 11A to 22A are perspective views the portion of the workpiece 100 at various fabrication stages, in accordance with some embodiments of the present disclosure. FIGS. 11B to 22B are X-Z cross-sectional views of the portion of the workpiece 100 at various fabrication stages along lines A-A' of FIGS. 2 and 11A to 22A, in accordance with some embodiments of the present disclosure. FIGS. 11C to 22C are X-Z cross-sectional views of the portion of the workpiece 100 at various fabrication stages along lines B-B' of FIGS. 2 and 11A to 22A, in accordance with some embodiments of the present disclosure. FIGS. 11D to 22D are Y-Z cross-sectional views of the portion of the workpiece 100 at various fabrication stages along lines C-C' of FIGS. 2 and 11A to 22A, in accordance with some embodiments of the present disclosure.

Figure 11A:
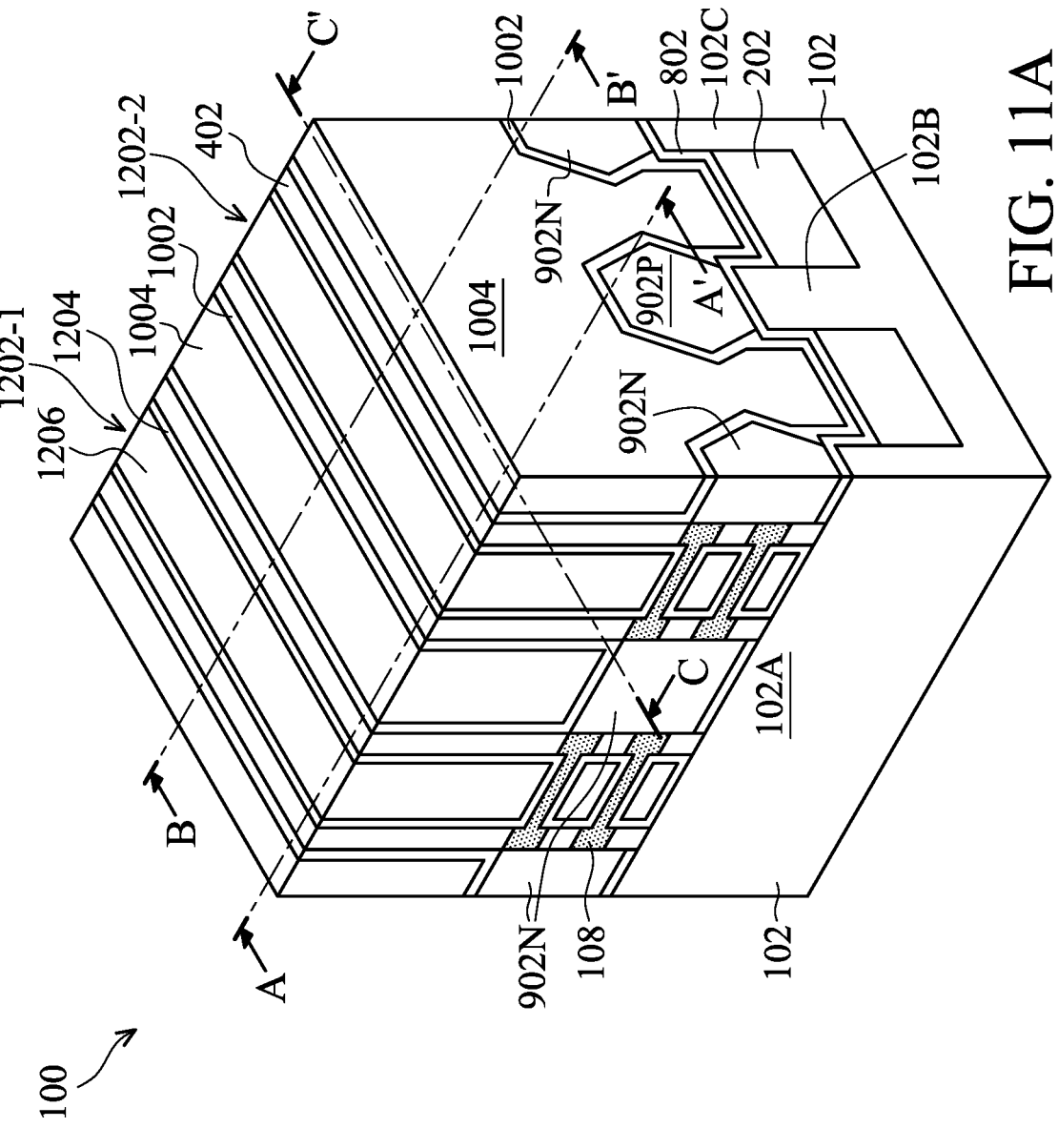
FIGS. 11A, 12A, 13A, 14A, 15A, 16A, 17A, 18A, 19A, 20A, 21A, and 22A are perspective views the portion of the workpiece at various fabrication stages, in accordance with some embodiments of the present disclosure.
Figures 11B, 11C:
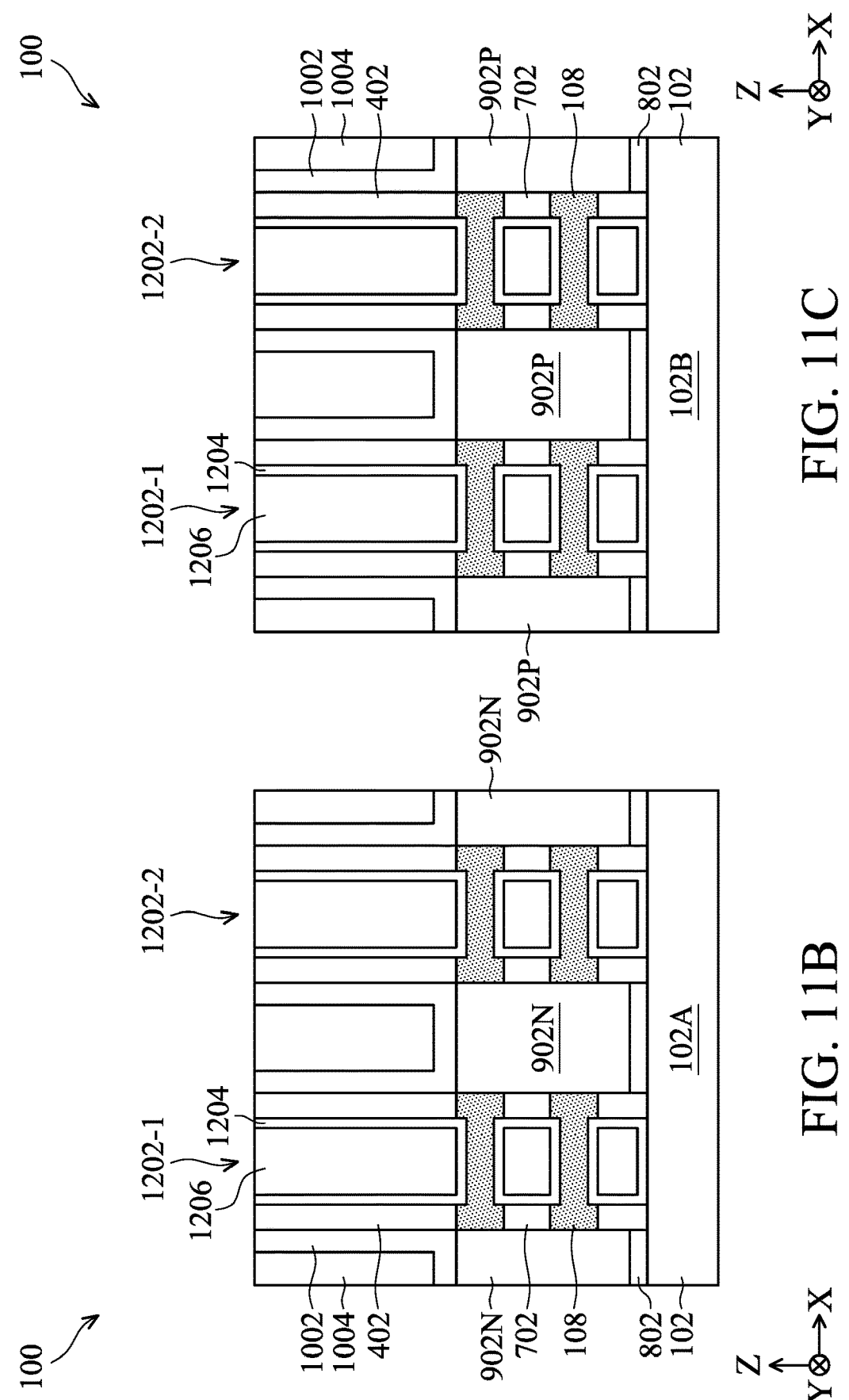
FIGS. 11B, 12B, 13B, 14B, 15B, 16B, 17B, 18B, 19B, 20B, 21B, and 22B are X-Z cross-sectional views of the portion of the workpiece at various fabrication stages along lines A-A' of FIGS. 2 and 11A to 22A, in accordance with some embodiments of the present disclosure.
FIGS. 11C, 12C, 13C, 14C, 15C, 16C, 17C, 18C, 19C, 20C, 21C, and 22C are X-Z cross-sectional views of the portion of the workpiece at various fabrication stages along lines B-B' of FIGS. 2 and 11A to 22A, in accordance with some embodiments of the present disclosure.
Figure 11D:
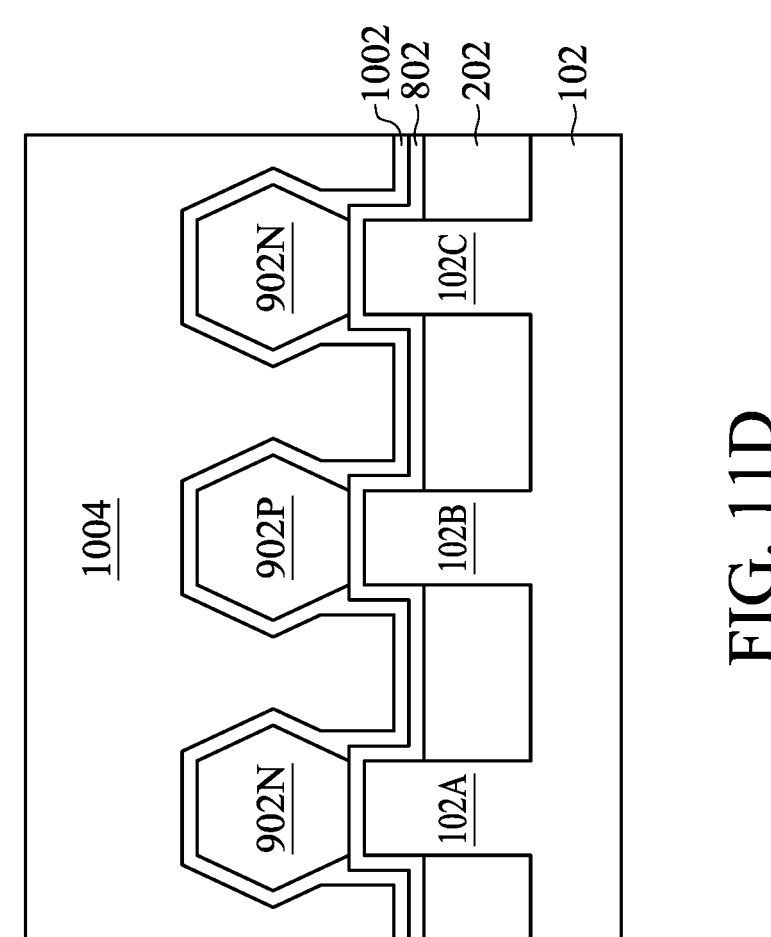
Figure 11D:
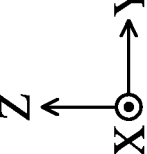
Figure 12A:
Figure 12A:
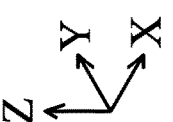
Figures 12B, 12C:
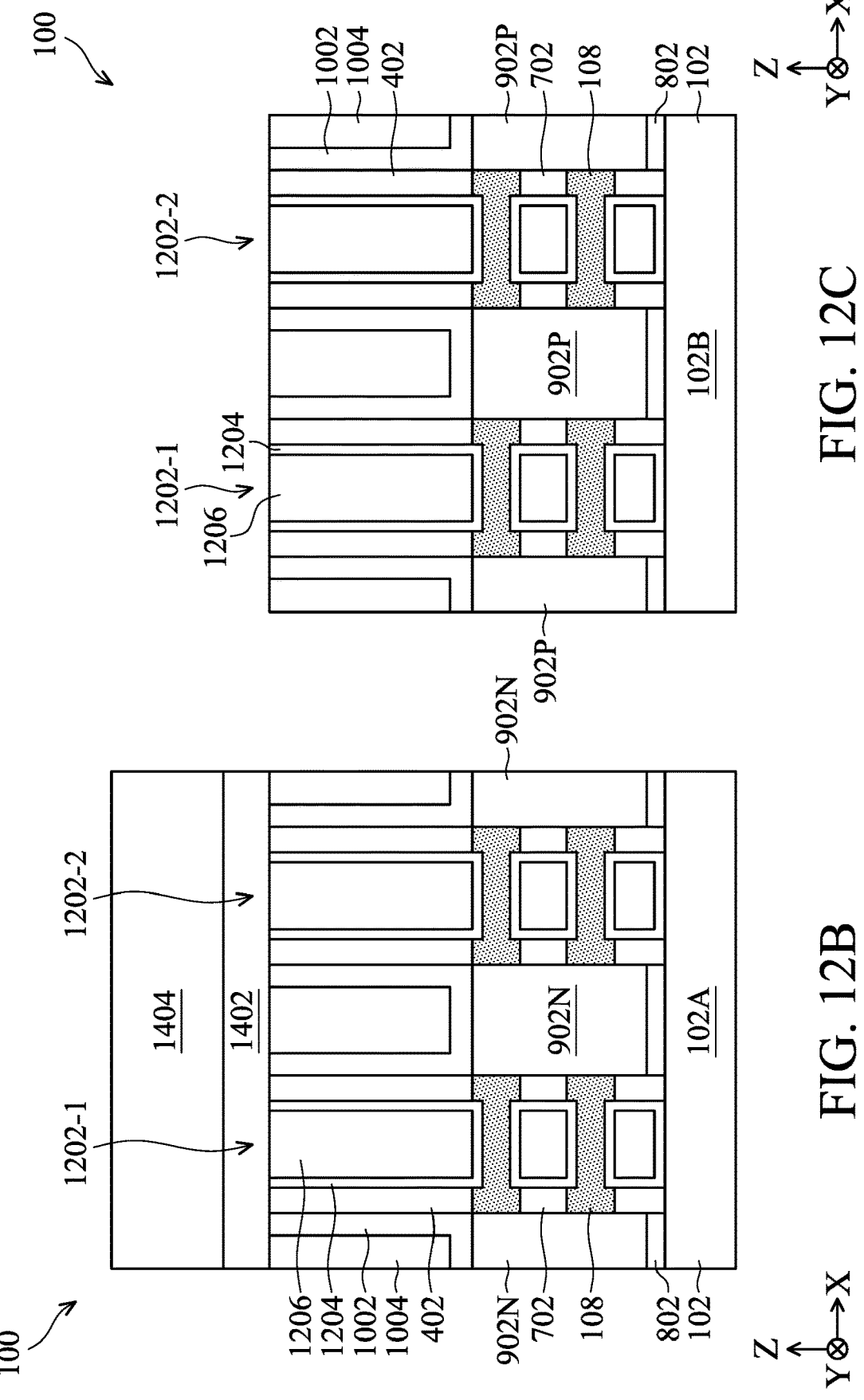
Figure 12D:
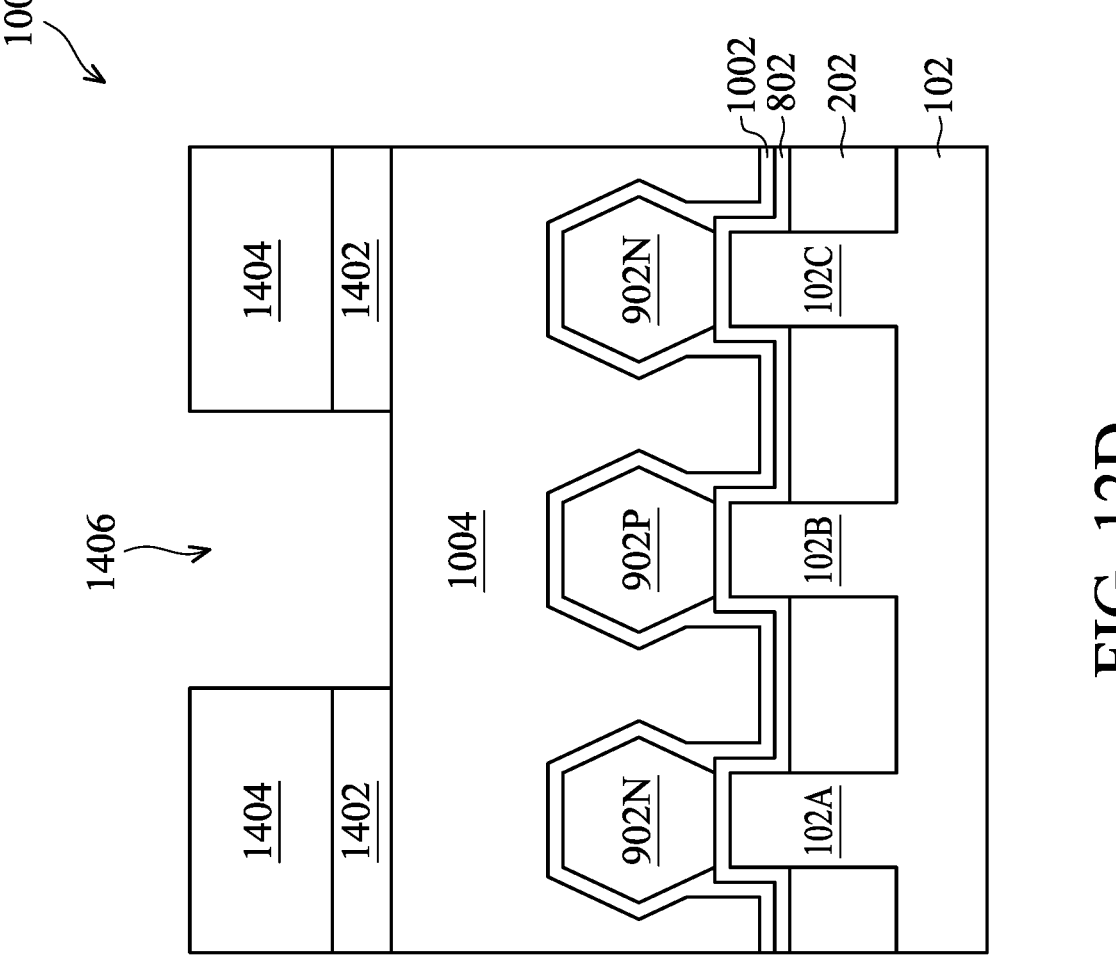
Figure 12D:
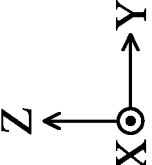

Referring to FIGS. 11A to 11D, gate structures 1202-1 and 1202-2 (may be collectively referred to as gate structures 1202) are formed in the gate trenches 1102 to wrap around the exposed semiconductor layers 108. As such, the dummy gate structures 302 are replaced with the gate structures 1202. As shown in FIGS. 11A, 11B, and 11C, the source/drain features 902N are formed on opposite sides of the gate structures 1202 in the X-direction, and the source/drain features 902P are also formed on opposite sides of the gate structures 1202 in the X-direction. The gate structures 1202 each includes gate dielectric layer 1204 and gate electrode 1206 over the gate dielectric layer 1204. In some embodiments, the gate dielectric layers 1204 are formed to wrap around the semiconductor layers 108, as shown in FIGS. 11A, 11B, and 11C. Additionally, the gate dielectric layers 1204 also formed on the sidewalls of the inner spacers 702 and the gate spacers 402 (shown in FIGS. 11A, 11B, and 11C). The gate dielectric layers 1204 may include a dielectric material having a dielectric constant greater than a dielectric constant of $SiO_2$, which is approximately 3.9. For example, the gate dielectric layers 1204 may include hafnium oxide ($HfO_2$), which has a dielectric constant in a range from about 18 to about 40. Alternatively, the gate dielectric layers 1204 may include other high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The gate dielectric layers 1204 may be formed by ALD, PVD, CVD, oxidation, and/or other suitable methods.

In some embodiments, the gate structures 1202 may further include interfacial layers to wrap around the exposed semiconductor layers 108 before the formation of the gate dielectric layer 1204, so that the gate dielectric layers 1204 are separated from the semiconductor layers 108 by the interfacial layers. Therefore, the gate dielectric layers 1204 wrap around the interfacial layer and the semiconductor layers 108. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

The gate electrodes 1206 are formed to fill the remaining spaces of the gate trenches 1102, and over the gate dielectric layers 1204 in such a way that the gate electrodes 1206 wrap around the semiconductor layers 108, the gate dielectric layer 1204, and the interfacial layers (if present). The gate electrodes 1206 each may include a single layer or alternatively a multi-layer structure. In some embodiments, the gate electrodes 1206 each may include a capping layer, a barrier layer, work function metal layers, and a fill material. The gate electrodes 1202-1 and 1202-2 may each has single or multiple work function metal materials. In some embodiments, the gate electrodes 1202-1 and 1202-2 may each has n-type work function metal layers for n-type transistors and p-type work function metal layers for p-type transistors. More specifically, the gate electrodes 1202-1 and 1202-2 may each has n-type work function metal layers between the source/drain features 902N for n-type transistors and p-type work function metal layers between the source/drain features 902P for p-type transistors, in accordance with some embodiments of the present disclosure.

In the case of the gate electrodes 1202 including n-type work function metal layers. In some embodiment, the n-type work function metal layer is a material such as Ti, Al, Ag, Mn, Zr, TiAl, TiAlC, TaC, TaCN, TaSiN, TaAl, TaAlC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer.

In the case of the gate electrodes 1202 including p-type work function metal layers. In some embodiment, the p-type work function metal layer may be a material such as TiN, TaN, Ru, Mo, Al, WN, ZrSi2, MoSi2, TaSi2, NiSi2, WN, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of. Additionally, the p-type work function metal layer may be deposited using a deposition process such as ALD, CVD, or the like, although any suitable deposition process may be used.

During the formation of the gate structures 1202, the materials of the gate dielectric layers 1204 and gate electrodes 1202 are also formed over the top surfaces of the gate spacers 402, the ESL 1002, and the dielectric layer 1004. Therefore, after the formation or deposition of the materials of the gate dielectric layers 1204 and gate electrodes 1202, a CMP process and/or other planarization process is performed to remove the excess materials of the gate dielectric layers 1204 and gate electrodes 1202 over the top surfaces of the gate spacers 402, the ESL 1002, and the dielectric layer 1004, thereby forming the gate structures 1202. In some embodiments, although not shown in FIGS. 11A to 11D, the CMP process also partially remove top portions of the gate spacers 402, the ESL 1002, the dielectric layer 1004, the gate dielectric layers 1204, and gate electrodes 1206, lowering the heights of the gate spacers 402, the ESL 1002, the dielectric layer 1004, the gate dielectric layers 1204, and the gate electrodes 1206.

Referring to FIGS. 12A to 12D, a hard mask layer 1402 and a bottom anti-reflective coating (BARC) layer 1404 are formed over the workpiece 100. More specifically, the hard mask layer 1402 is formed over the gate structures 1202, the gate spacers 402, the ESL 1002, and the dielectric layer 1004, and the BARC layer 1404 is formed over the hard mask layer 1402. After the formation of the hard mask layer 1402 and the bottom BARC layer 1404, portions of the hard mask layer 1402 and the bottom BARC layer 1404 are further recessed and removed to include an opening 1406 passing through the hard mask layer 1402 and the BARC layer 1404. The opening 1406 exposes portions of the gate structures 1202, the gate spacers 402, the ESL 1002, and the dielectric layer 1004 over the source/drain features 902P.

In some embodiments, the hard mask layer 1402 may include a dielectric material, such as $Al_2O_3$, SiN, SiCN, SiOCN, SiOC, SiON, or combinations thereof. The hard mask layer 1402 may be formed by CVD, PVD, ALD, HDPCVD, MOCVD, RPCVD, PECVD, LPCVD, atomic layer CVD (ALCVD), atmospheric pressure CVD (APCVD), other suitable methods, or combinations thereof. In some embodiments, the BARC layer 1402 may include or be photoresist having photosensitive material. In other embodiments, the BARC layer 1402 may include TIN, SiON, or other suitable material. In various embodiments, the BARC layer 1402 may be formed by CVD, subatmospheric CVD (SACVD), flowable CVD (FCVD), ALD, spin-on coating, and/or other suitable process, or a combination thereof.

Figure 13A:
Figure 13A:
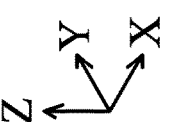
Figures 13B, 13C:
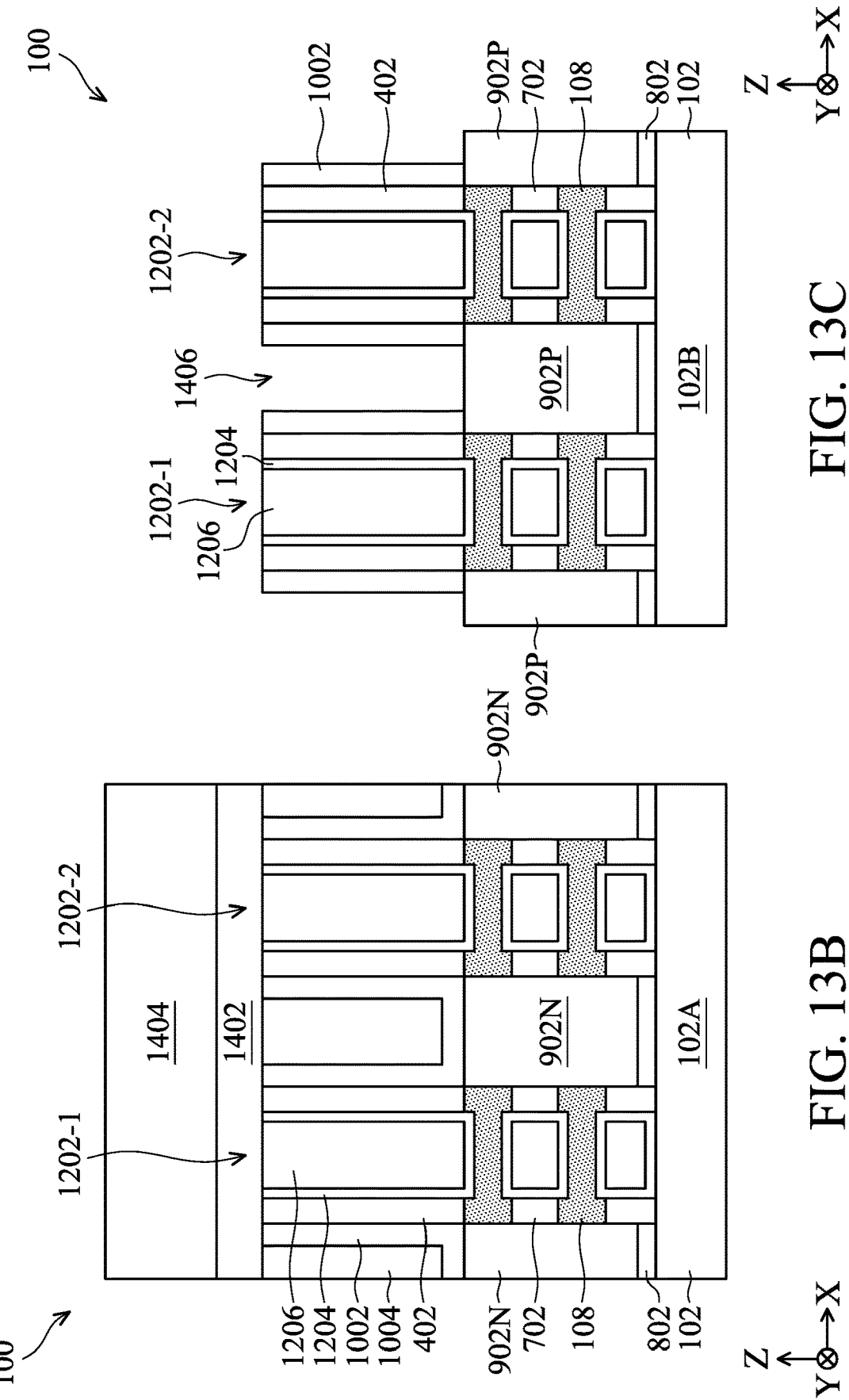
Figure 14A:
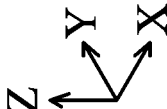
Figures 14B, 14C:
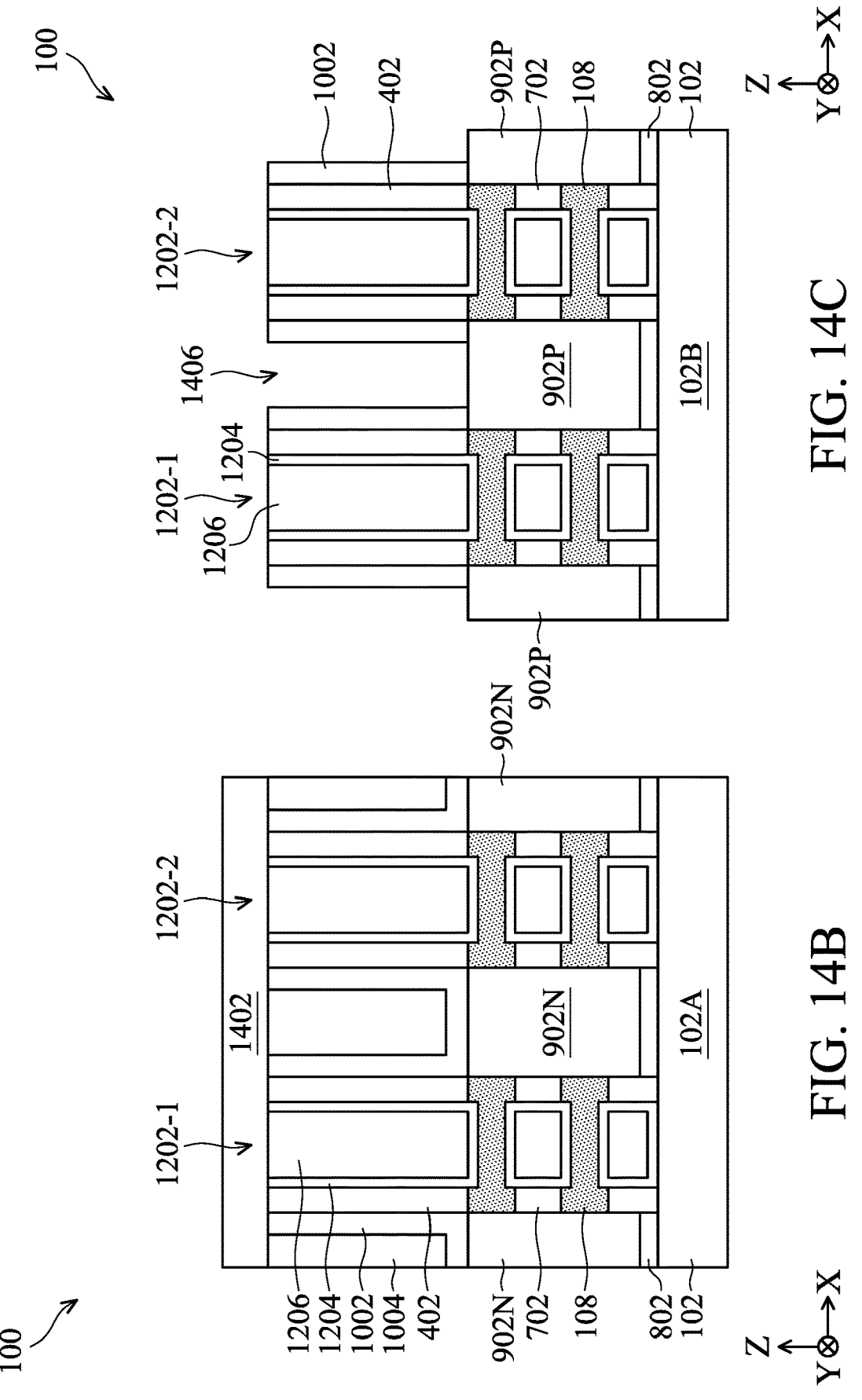
Figure 14D:
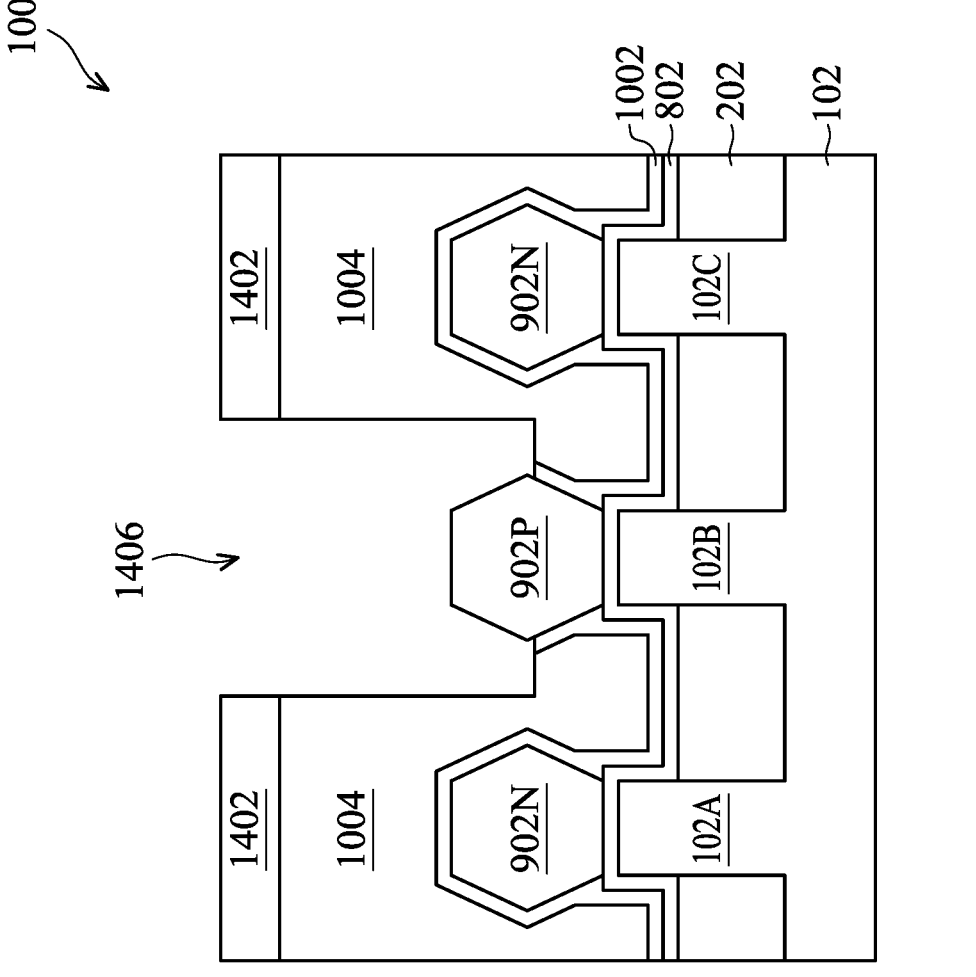
Figure 14D:
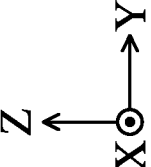

Referring to FIGS. 13A to 13D, the portions of the ESL 1002 and the dielectric layer 1004 over the source/drain features 902P and exposed in the opening 1406 are recessed or removed by one or more etching processes. As shown in FIGS. 13A to 13C, top surfaces of the source/drain features 902P are exposed. More specifically, upper half portions of the source/drain features 902P are exposed. Furthermore, portions of (sloped) sidewalls of lower half portions of the source/drain features 902P are also exposed, as shown in FIG. 13D. It should be noted that the ESL 1002 on the sidewalls of the gate spacers 402 remains without being removed by the one or more etching processes. After the one or more etching processes for removing the portions of the ESL 1002 and the dielectric layer 1004 over the source/drain features 902P and exposed in the opening 1406 to expose the upper half portions of the source/drain features 902P, an ion implantation is performed to dope the source/drain features 902P with p-type dopants (such as boron, indium, other p-type dopant, or combinations thereof). This is because that the p-type dopants in the previously formed source/drain features 902P (at the fabrication stage shown in FIGS. 8A to 8C) may have been partially lost. One or more annealing processes may be performed to activate the dopants in the source/drain features 902P. The annealing processes may include rapid thermal annealing (RTA) and/or laser annealing processes.

Referring to FIGS. 14A to 14D, the BARC layer 1404 is removed by a selective etching process. Specifically, the selective etching process is performed that selectively etches or removes the BARC layer 1404 over the hard mask layer 1402, with minimal (or no) etching of the hard mask layer 1402, the ESL 1002, the dielectric layer 1004, the gate spacers 402, the gate structures 1202 (the gate dielectric layers 1204 and the gate electrodes 1206), and the source/drain features 902P. The selective etching process is a dry etching process, a wet etching process, other suitable etching process, or combinations thereof.

Figure 15A:
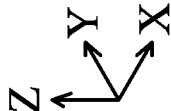
Figures 15B, 15C:
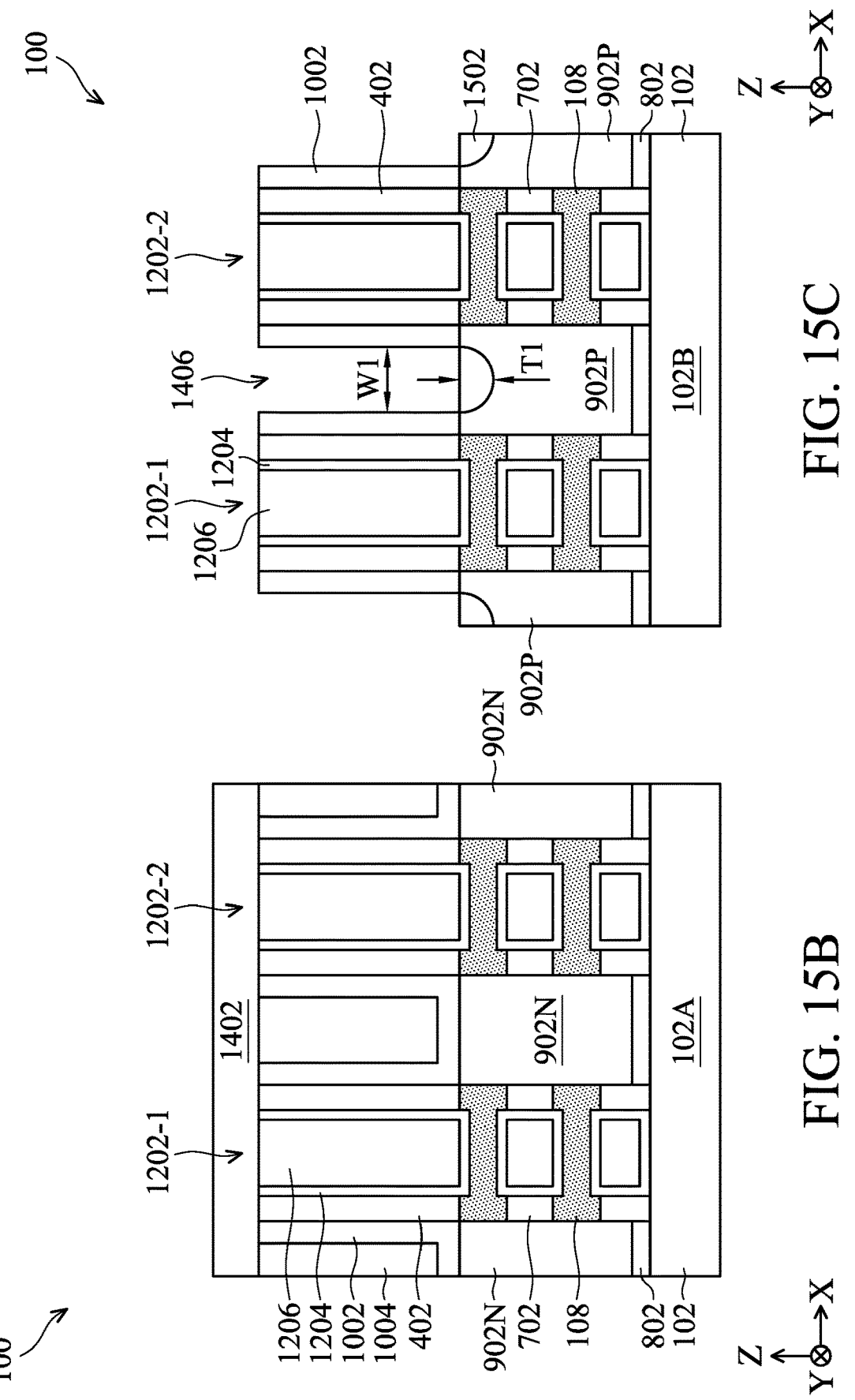
Figure 15D:
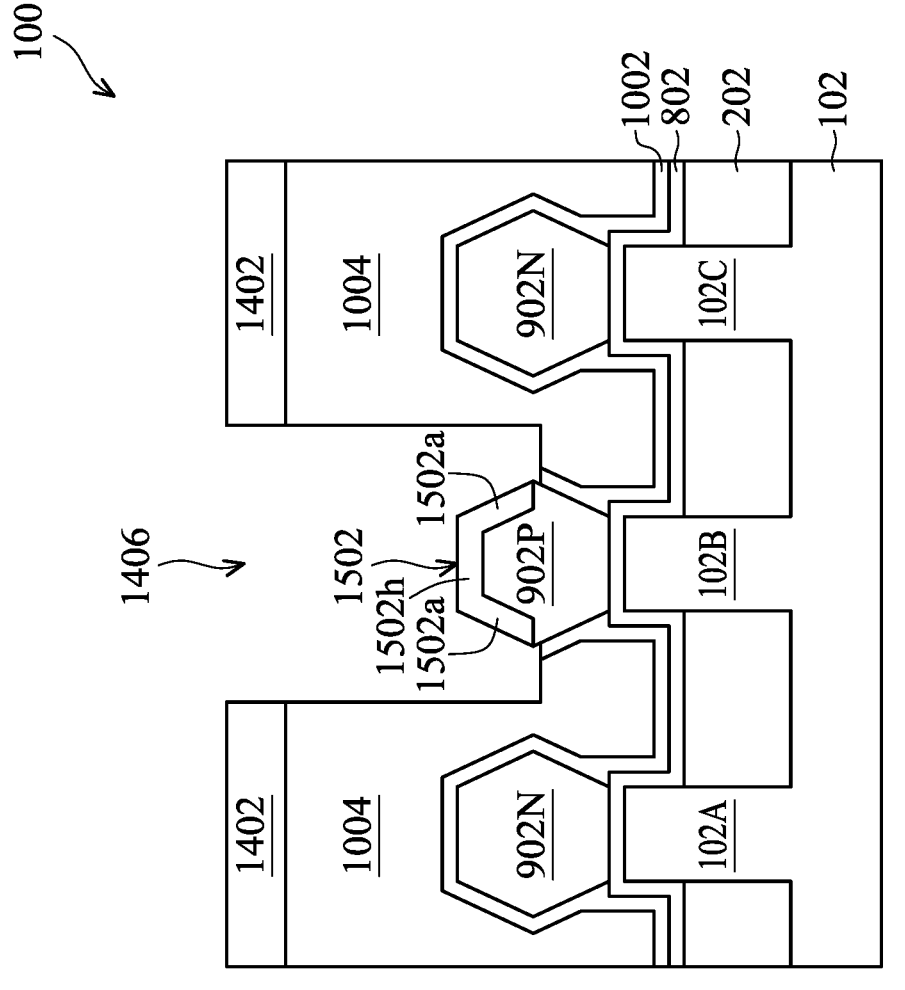
Figure 15D:
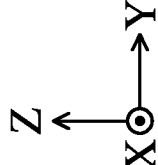
Figure 16A:
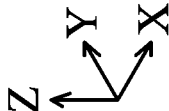
Figures 16B, 16C:
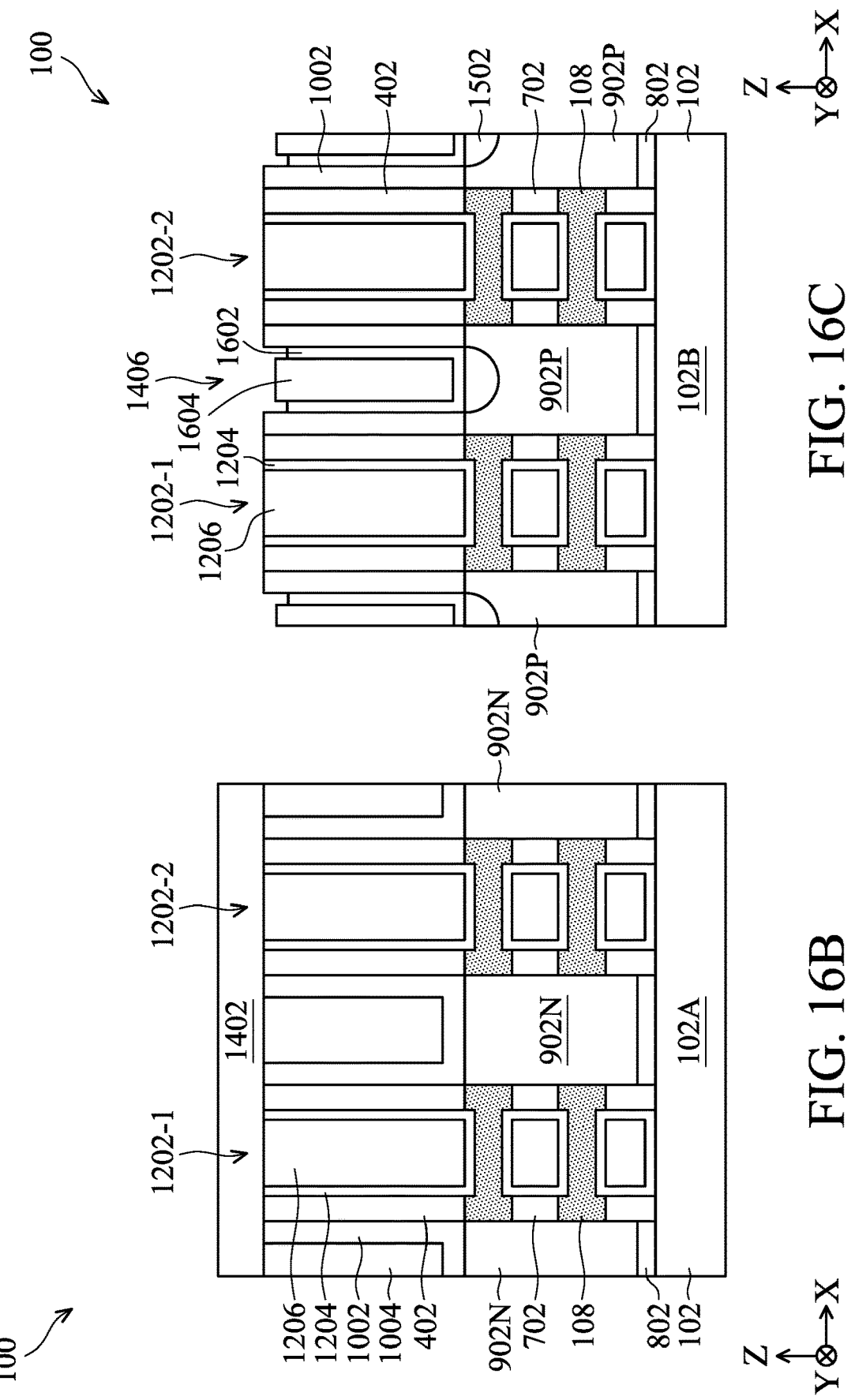

Referring to FIGS. 15A to 15D, silicide features 1502 are formed over the source/drain features 902P. Specifically, portions of the source/drain features 902P are transformed into silicide features 1502, as shown in FIGS. 15A, 15C, and 15D. In some embodiments, to form the silicide features 1502, metal layers are formed on top surfaces and (sloped) sidewalls of the upper half portions of the source/drain features 902P without being formed on lower half portions of the source/drain features 902P, the dielectric layer 1004, and the hard mask layer 1402. Then, the portions of the upper half portions of the source/drain features 902P react with the metal layers to be transformed into the silicide features 1502. After the formation of the silicide features 1502, the metal layers are removed. The metal layers may include metal materials having work function matching p-type source/drain features (the source/drain features 902P) for the silicide features 1502. For example, the metal layers may include Mo, Ni, Ru, other suitable materials for p-type source/drain features, or combinations thereof. Therefore, the silicide features 1502 also include Mo, Ni, Ru, other suitable metal materials for p-type source/drain features, or combinations thereof. These metal materials in the silicide features 1502 may form a compound with the silicon in the silicide features 1502. As such, in some embodiments, the silicide features 1502 may include Molybdenum silicide ($MoSi_2$), nickel silicide (NiSi), ruthenium silicide (RuSi), or other suitable compounds.

As shown in FIG. 15C, in the Y-Z cross-sectional view, the source/drain features 902P respectively have a concave top surface in contact with the silicide features 1502. More specifically, the silicide features 1502 respectively have a convex bottom surface complementary to and in contact with the concave top surfaces of the source/drain features 902P. In some embodiments, a width W1 of the silicide features 1502 in the X-direction is in a range from about 5 nm to about 30 nm. Furthermore, a thickness T1 of the silicide features 1502 in the X-direction is in a range from about 2 nm to about 10 nm.

As shown in FIG. 15D, in the Y-Z cross-sectional view, the silicide features 1502 wrap around the upper half portions of the source/drain features 902P. More specifically, each of the silicide features 1502 has a horizontal portion 1502h extending in the Y-direction and two extending arms 1502a, as shown in the Y-Z cross-sectional view of FIG. 15D. The horizontal portion 1502h is over and in contact with topmost surfaces of the upper half portions of the source/drain features 902P. Each of the extending arms 1502a is over and in contact with the (sloped) sidewalls of the upper half portions of the source/drain features 902P. Furthermore, bottom surfaces of the extending arms 1502a (bottommost surfaces of the silicide features 1502) are over and in contact with the top surfaces of the lower half portions of the source/drain features 902P. In some aspects, in the Y-Z cross-sectional view, each of the source/drain features 902P has a stool-like shape constructed by the horizontal portion 1502h and the two extending arms 1502a, as shown in FIG. 15D.

Referring to FIGS. 16A to 16D, after the formation of the source/drain features 902P, a dielectric layer 1602 and an oxide layer 1604 are formed to cover the silicide features 1502 and the source/drain features 902P. More specifically, to form the dielectric layer 1602 and the oxide layer 1604, a dielectric material for the dielectric layer 1602 is conformally formed over the ESL 1002, the dielectric layer 1004, the gate structures 1202 (the gate dielectric layers 1204 and the gate electrodes 1206), the gate spacers 402, and the hard mask layer 1402 and on sidewalls of the 1002, the dielectric layer 1004, and the hard mask layer 1402; and an oxide material for the oxide layer 1604 is then formed over the dielectric material. Then, the oxide material for the oxide layer 1604 is etched back to expose top surfaces of the dielectric material for the dielectric layer 1602 over the ESL 1002, the gate structures 1202 (the gate dielectric layers 1204 and the gate electrodes 1206), the gate spacers 402, and the hard mask layer 1402. After the etching back of the oxide material for the oxide layer 1604, portions of the dielectric material for the dielectric layer 1602 over the ESL 1002, the gate structures 1202 (the gate dielectric layers 1204 and the gate electrodes 1206), the gate spacers 402, and the hard mask layer 1402 are removed. As such, reaming portions of the dielectric material and the oxide material form the dielectric layer 1602 and the oxide layer 1604 covering the silicide features 1502 and the source/drain features 902P and in the opening 1406, as shown in FIGS. 16A to 16D. In some embodiments, the dielectric material of the dielectric layer 1602 includes aluminum oxide ($AlO_x$). In other embodiments, the dielectric material of the dielectric layer 1602 includes $TiO_2$, $Ta_2O_3$, $ZrO_2$, LaO, AlO, ZrO, TiO, $Si_3N_4$, $Al_2O_3$, SiN, SiCN, SiOCN, SiOC, SiON, or combinations thereof. The oxide material for the oxide layer 1604 may be formed in low temperature. Therefore, the oxide layer 1604 may include low temperature oxide, such as silicon oxide formed in low temperature.

Figure 17A:
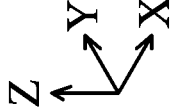
Figures 17B, 17C:
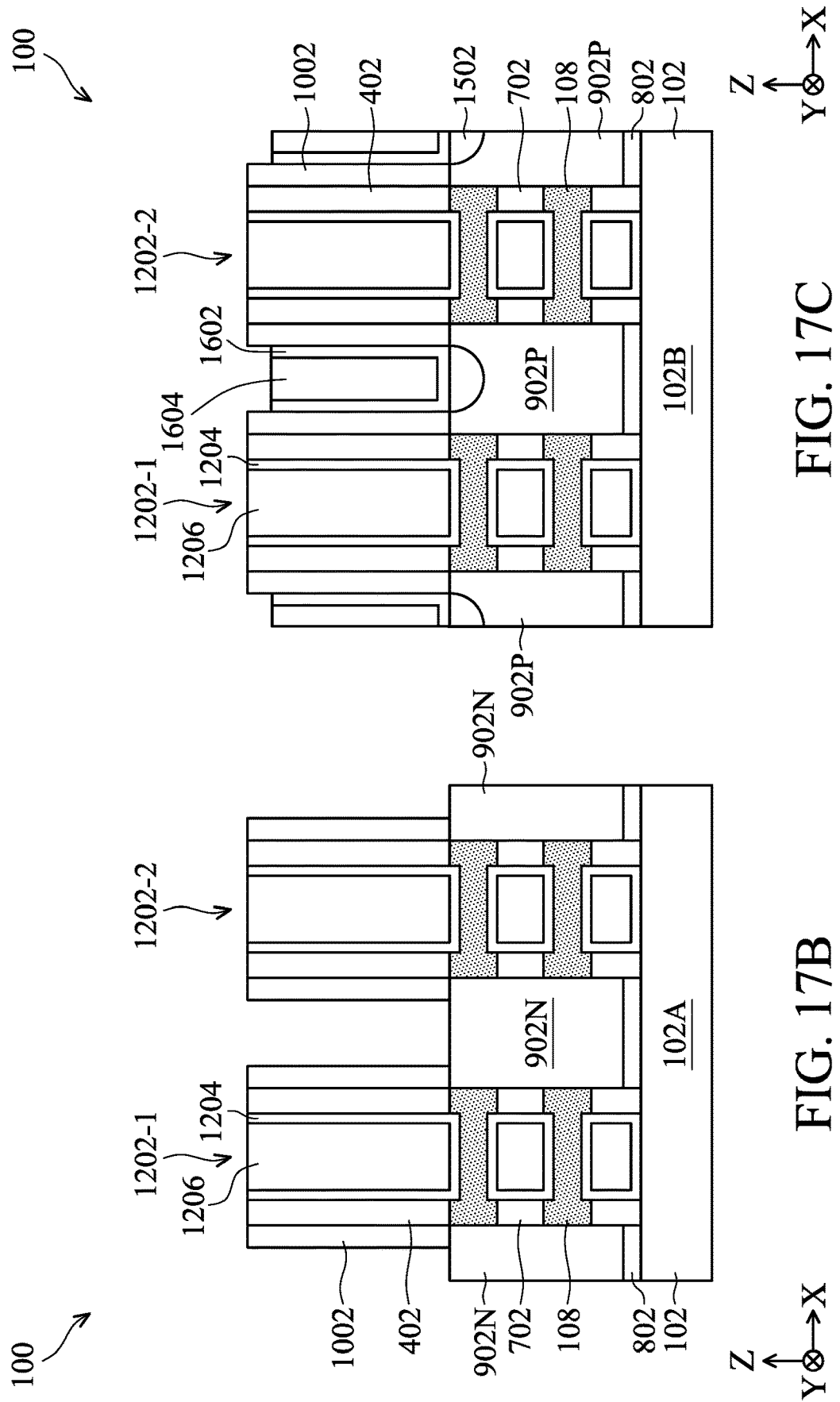
Figure 17D:
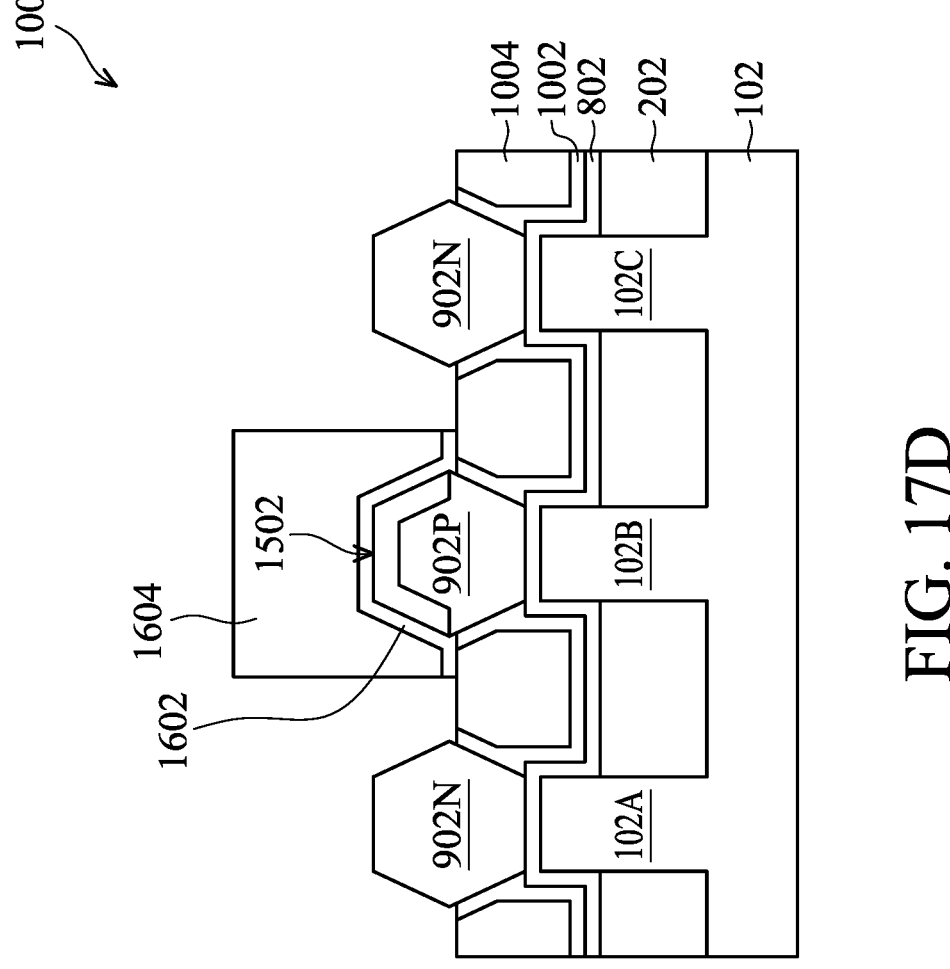
Figure 17D:
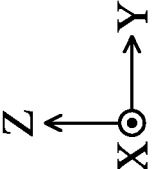

Referring to FIGS. 17A to 17D, the hard mask layer 1402, portions of the ESL 1002, and portions of the dielectric layer 1004 over the source/drain features 902N are recessed or removed by one or more etching processes. As shown in FIGS. 17A to 17C, top surfaces of the source/drain features 902N are exposed. More specifically, upper half portions of the source/drain features 902N are exposed. Furthermore, portions of (sloped) sidewalls of lower half portions of the source/drain features 902N are also exposed, as shown in FIG. 17D. It should be noted that the ESL 1002 on the sidewalls of the gate spacers 402 remains without being removed by the one or more etching processes.

Furthermore, after the recessing of the ESL 1002 and the dielectric layer 1004, top surfaces of the ESL 1002 and the dielectric layer 1004 are lower than bottommost surfaces of the silicide features 1502 and 1702. In some aspect, the top surfaces of the ESL 1002 and the dielectric layer 1004 are lower than the top surfaces of the lower half portions of the source/drain features 902N and 902P. In some embodiments, the ESL 1002 is in contact with the (sloped) sidewalls of the lower half portions of the source/drain features 902N and 902P, as shown in FIG. 17D.

Figure 18A:
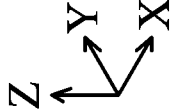
Figures 18B, 18C:
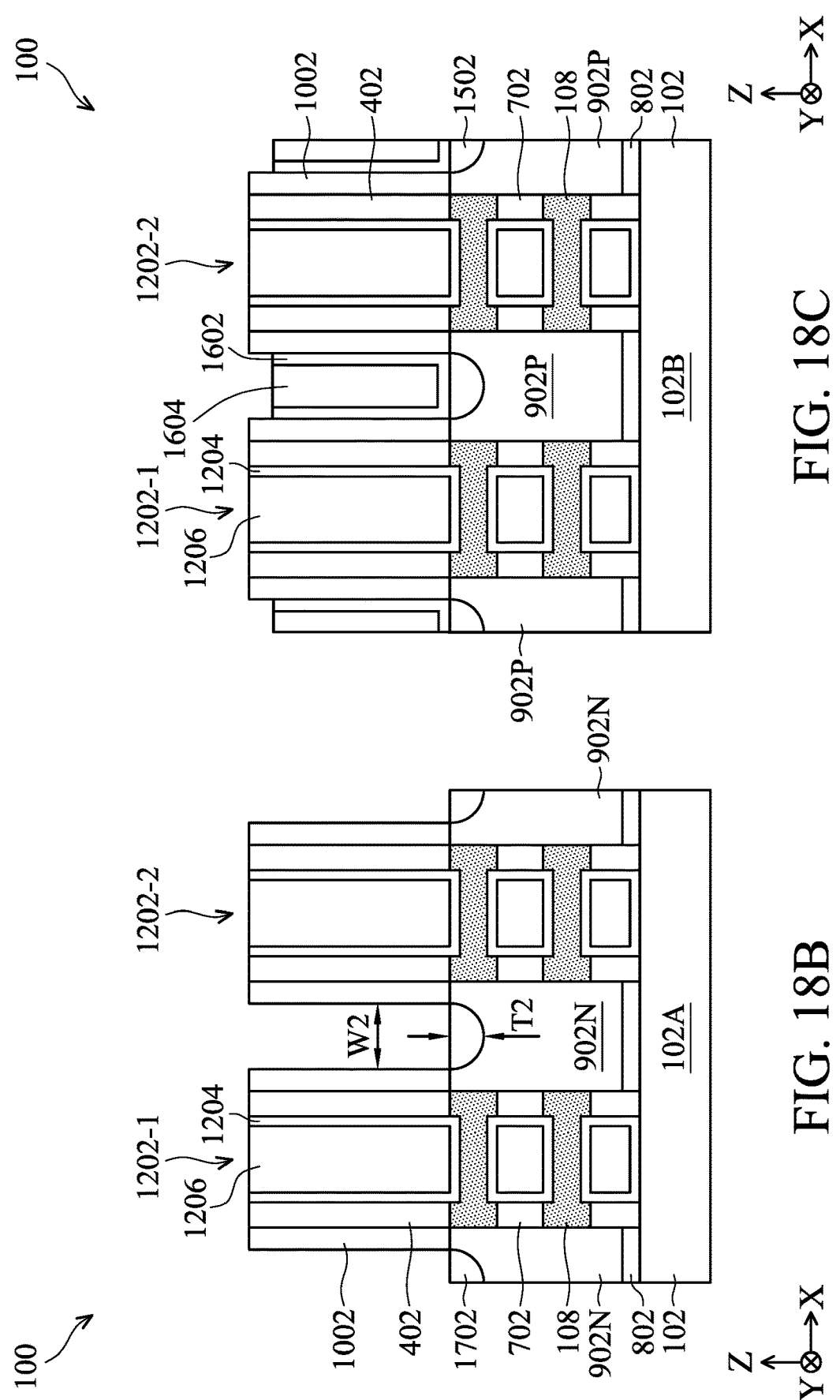
Figure 18D:
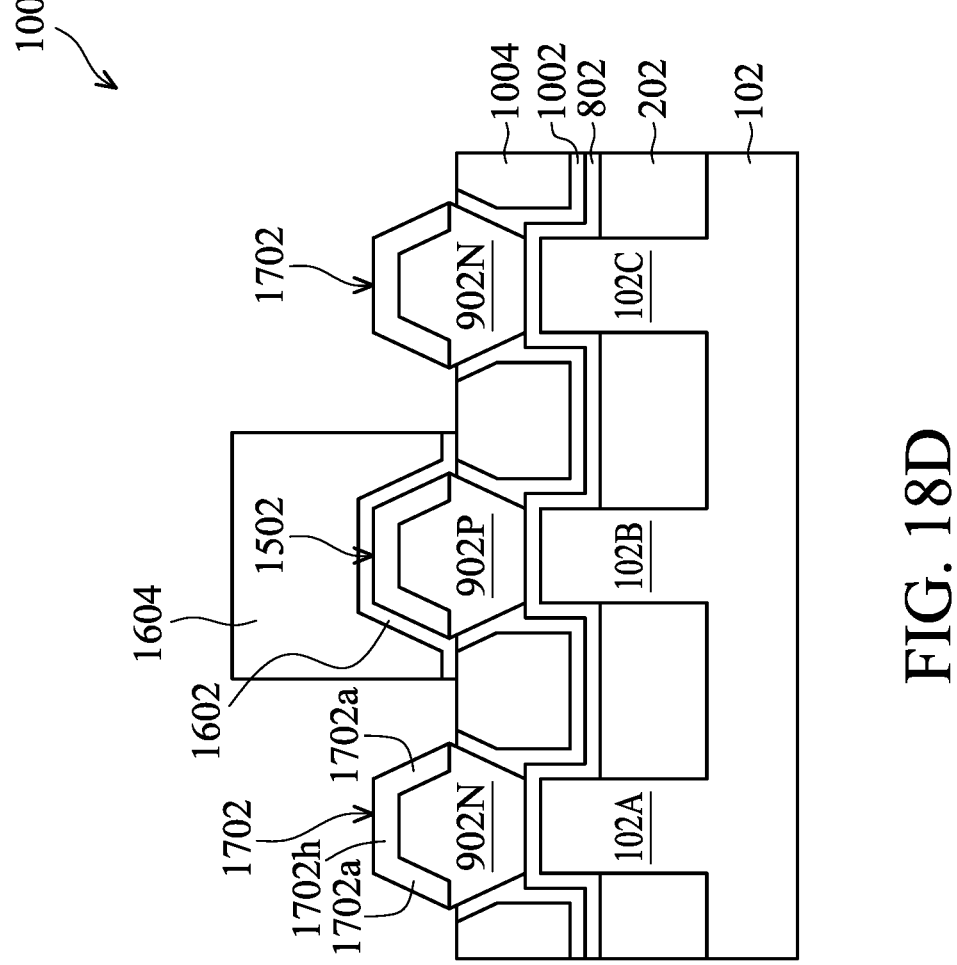
Figure 19A:
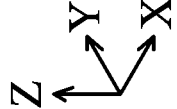
Figures 19B, 19C:
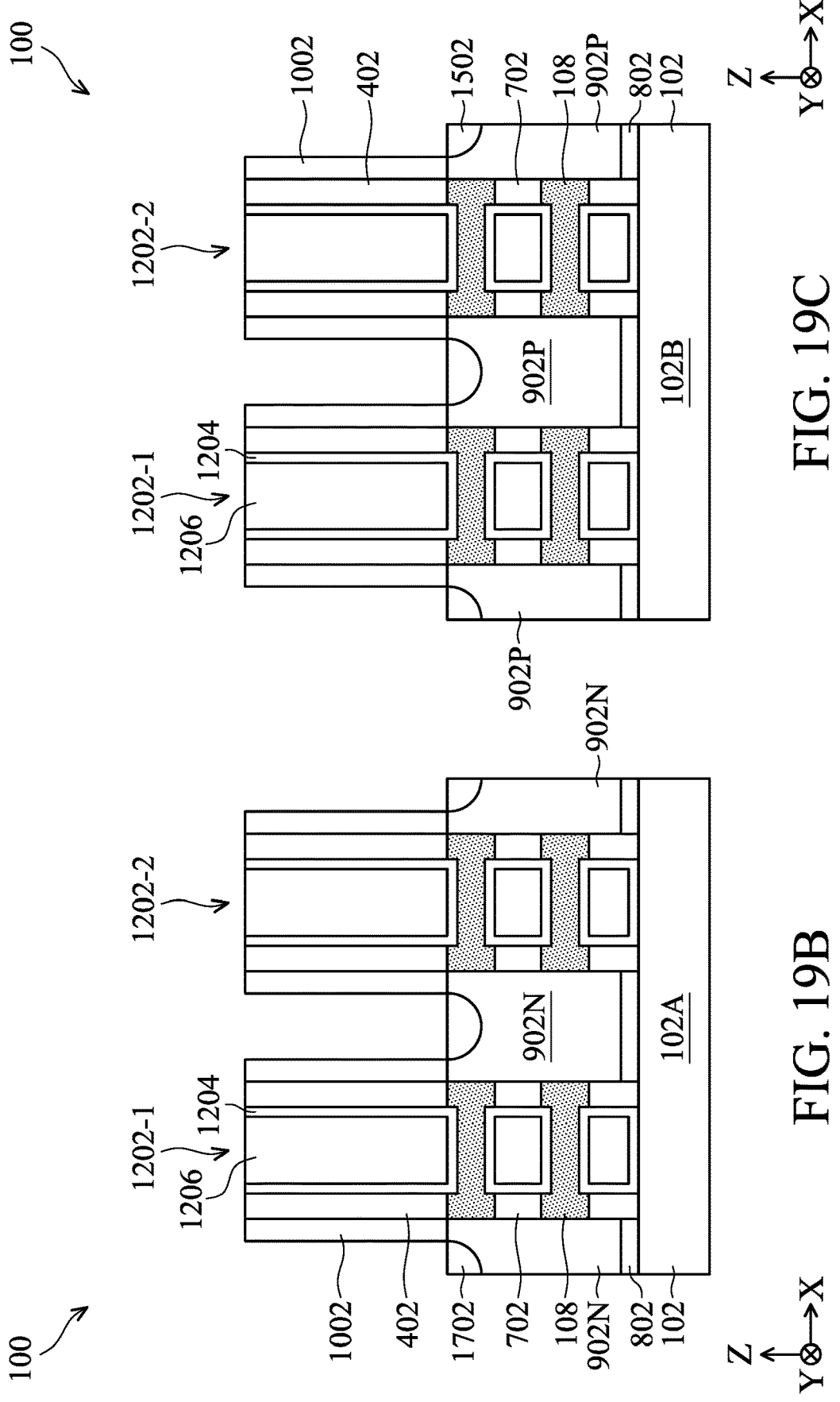

Referring to FIGS. 18A to 18D, silicide features 1702 are formed over the source/drain features 902N. Specifically, portions of the source/drain features 902N are transformed into silicide features 1702, as shown in FIGS. 18A, 18B, and 18D. In some embodiments, to form the silicide features 1702, metal layers are formed on top surfaces and (sloped) sidewalls of the upper half portions of the source/drain features 902N without being formed on lower half portions of the source/drain features 902N, the dielectric layer 1004, and the hard mask layer 1402. Then, the portions of the upper half portions of the source/drain features 902N react with the metal layers to be transformed into the silicide features 1702. After the formation of the silicide features 1702, the metal layers are removed. The metal layers may include metal materials having work function matching n-type source/drain features (the source/drain features 902N) for the silicide features 1702. For example, the metal layers may include Sb, Zr, Y, other suitable materials for n-type source/drain features, or combinations thereof. Therefore, the silicide features 1702 also include Sb, Zr, Y, other suitable metal materials for n-type source/drain features, or combinations thereof. These metal materials in the silicide features 1702 may form a compound with the silicon in the silicide features 1702. As such, in some embodiments, the silicide features 1702 may include antimony silicide (SbSi), zirconium silicide ($ZrSi_2$), yttrium silicide ($YSi_2$), or other suitable compounds.

It should be noted that the material or composition of the silicide features 1702, including Sb, Zr, Y, etc., is different from the material or composition of the silicide features 1502, including Mo, Ni, Ru, etc. Therefore, the silicide features 1502 and the silicide features 1702 individually have work function matching the source/drain features 902P and the source/drain features 902N. As such, the contact resistances between the silicide features and the source/drain features are reduced, thereby improving the performance of the resultant transistors or devices.

As shown in FIG. 18B, in the Y-Z cross-sectional view, the source/drain features 902N respectively have a concave top surface in contact with the silicide features 1702. More specifically, the silicide features 1702 respectively have a convex bottom surface complementary to and in contact with the concave top surfaces of the source/drain features 902N. In some embodiments, a width W2 of the silicide features 1702 in the X-direction is in a range from about 5 nm to about 30 nm. Furthermore, a thickness T2 of the silicide features 1702 in the X-direction is in a range from about 2 nm to about 10 nm.

As shown in FIG. 18D, in the Y-Z cross-sectional view, the silicide features 1702 wrap around the upper half portions of the source/drain features 902N. More specifically, each of the silicide features 1702 has a horizontal portion 1702h extending in the Y-direction and two extending arms 1702a, as shown in the Y-Z cross-sectional view of FIG.

18D. The horizontal portion 1702$h$ is over and in contact with topmost surfaces of the upper half portions of the source/drain features 902N. Each of the extending arms 1702$a$ is over and in contact with the (sloped) sidewalls of the upper half portions of the source/drain features 902N. Furthermore, bottom surfaces of the extending arms 1702$a$ (bottommost surfaces of the silicide features 1702) are over and in contact with the top surfaces of the lower half portions of the source/drain features 902N. In some aspects, in the Y-Z cross-sectional view, each of the source/drain features 902N has a stool-like shape constructed by the horizontal portion 1702$h$ and the two extending arms 1702$a$, as shown in FIG. 18D. Therefore, the contact areas between the silicide features 1502/1702 and the source/drain features 902P/902N are greater than existing technology, thereby having smaller contact resistances and improving the performance of the resultant transistors or devices.

Referring to FIGS. 19A to 19D, the dielectric layer 1602 and the oxide layer 1604 covering the silicide features 1502 and the source/drain features 902P are removed by one or more etching processes. The one or more etching processes are selective etching processes. More specifically, one or more etching processes are performed that selectively etches the dielectric layer 1602 and the oxide layer 1604 covering the silicide features 1502 and the source/drain features 902P, with minimal (or no) etching of the ESL 1002, the dielectric layer 1004, the gate structures 1202 (the gate dielectric layers 1204 and the gate electrodes 1206), the gate spacers 402, the source/drain features 902N, the source/drain features 902P, the silicide features 1502, and the silicide features 1702, such that the silicide features 1502 and the source/drain features 902P are exposed. The one or more etching processes are dry etching processes, wet etching processes, other suitable etching processes, or combinations thereof.

Referring to FIGS. 20A to 20D, an ESL 1802 and an ILD layer 1804 are formed over the workpiece 100. The ESL 1802 is first conformally formed over and in contact with the top surfaces of the ESL 1002, the gate structures 1202 (the gate dielectric layers 1204 and the gate electrodes 1206), the gate spacers 402, the silicide features 1502, and the silicide features 1702 and on the sidewalls of the gate spacers 402. After the formation of the ESL 1802, the ILD layer 1804 is then formed over the ESL 1802 and inside the ESL 1802. In some embodiments, the ILD layer 1804 is also formed over ESL 1002, the dielectric layer 1004, the source/drain features 902N, the source/drain features 902P, the silicide features 1502, and the silicide features 1702. Subsequent to the formation of the ESL 1802 and the ILD layer 1804, a CMP process and/or other planarization process is performed on the ESL 1802, the ILD layer 1804, the gate spacers 402, and the gate structures 1202 (the gate dielectric layers 1204 and the gate electrodes 1206). In some embodiments, the CMP process also partially remove top portions of the gate spacers 402, the ESL 1002, and the gate structures 1202 (the gate dielectric layers 1204 and the gate electrodes 1206), lowering the heights of the gate spacers 402, the ESL 1002, and the gate structures 1202, as shown in FIGS. 20A to 20D.

The ESL 1802 includes a material that is different than the ILD layer 1804. The ESL 1802 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 1804 may include SiOCN. In some embodiments, the ILD layer 1804 may include a material containing compositions of Si, O, C, and/or N, such as SiC, SiOC, SiON, SiCN, SiOCN, or other suitable material. In some embodiments, the ILD layer 1804 may be formed by PECVD (plasma-enhanced CVD), FCVD (flowable CVD), or other suitable methods. It is noted that the dielectric material of the ILD layer 1804 is different from the dielectric material of the dielectric layer 1004. In some embodiments, the ILD layer 1804 includes SiOCN and the dielectric layer 1004 includes SiOC, as discussed above. In other embodiments, the ILD layer 1804 and the dielectric layer 1004 both include SiOCN, but have different Si/O/C/N ratio. Compared to the ILD layer 1804, the dielectric layer 1004 may have lower or no N elements for having lower k value (dielectric constant) and higher etching rate, which is facilitating the recessing of the dielectric layer 1004 for the formation of the silicide features 1502 and the silicide features 1702.

Figure 20A:
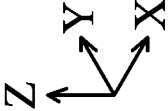
Figures 20B, 20C:
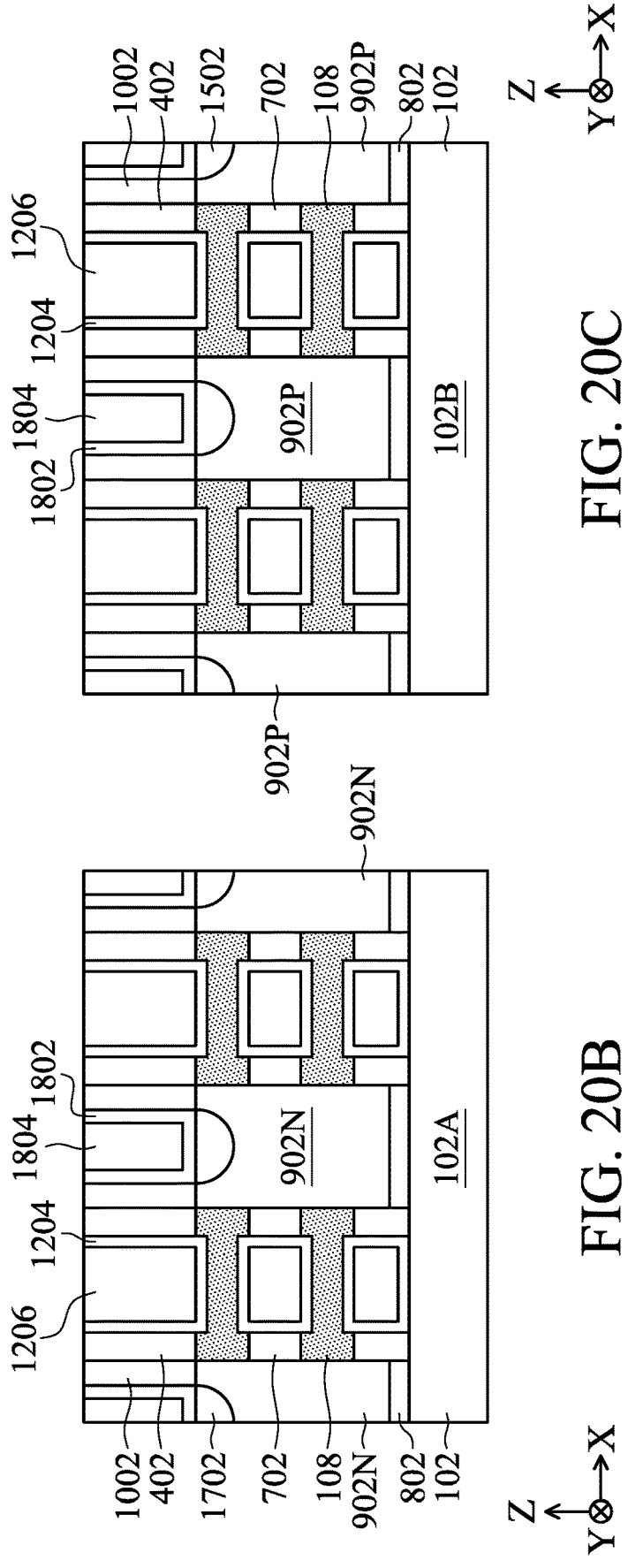
Figure 21A:
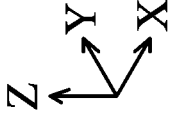
Figures 21B, 21C:
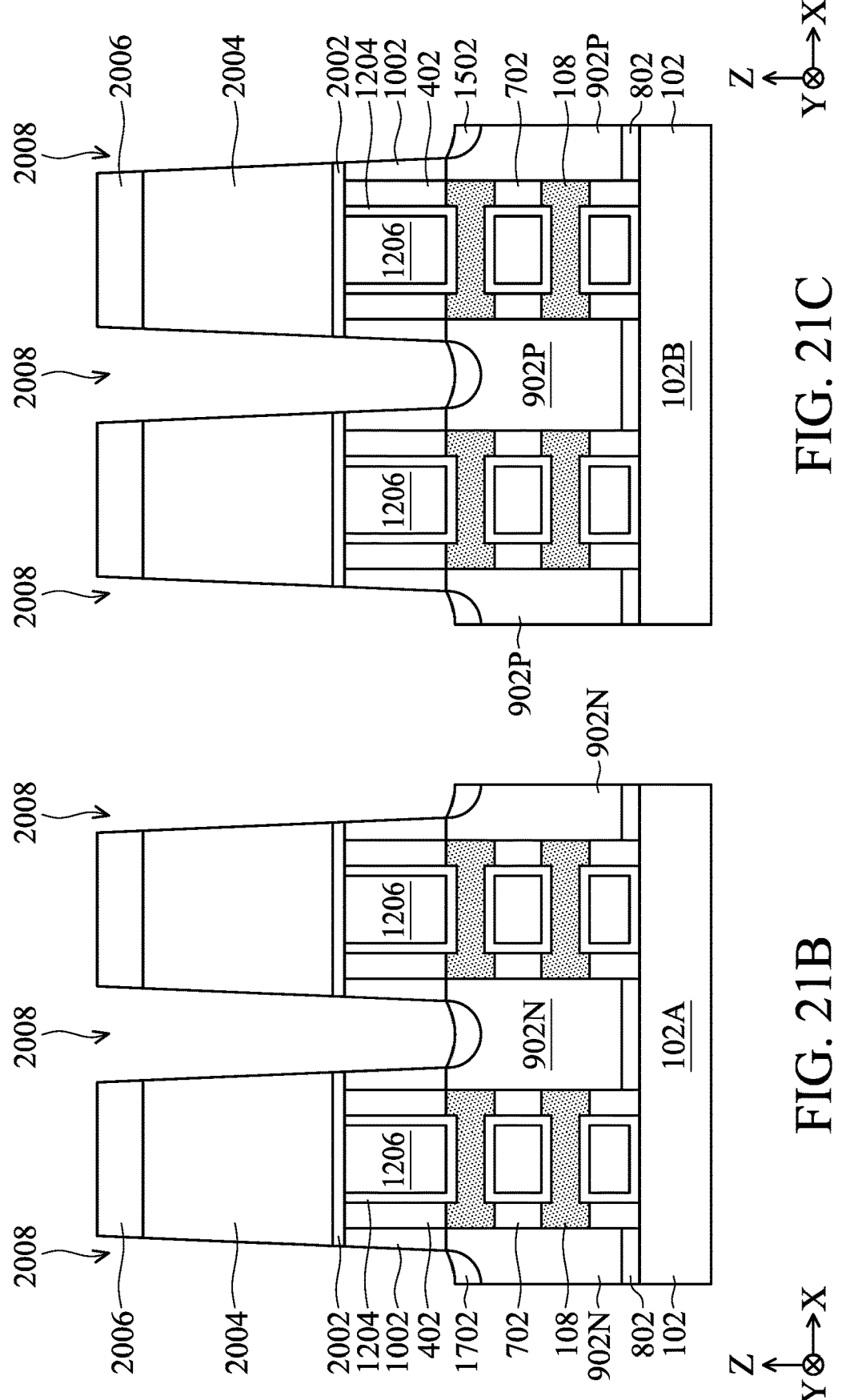

Still referring to FIGS. 20A to 20D, after the formation of the ESL 1802 and the ILD layer 1804, a dielectric structure 1902 is formed to cut each of the gate structures 1202 into two segments. More specifically, the dielectric structure 1902 extends lengthwise in the X-direction to cut and across the gate structures 1202, the gate spacers 402, the ESL 1002, the dielectric layer 1004, the ESL 1802, the ILD layer 1804, the dielectric layer 802, and the isolation structure 202, as shown in FIG. 20A. The dielectric structure 1902 further extends vertically in the Z-direction to pass through the ESL 1002, the dielectric layer 1004, the ESL 1802, the ILD layer 1804, the dielectric layer 802, and the isolation structure 202, as shown in FIG. 20D. As shown in FIG. 20D, the dielectric structure 1902 is between the 902P and 902N in the Y-direction. Furthermore, a bottom surface of the dielectric structure 1902 is in contact with the substrate 102. In some embodiments, barrier layers 1904 are formed on sidewalls of the dielectric structure 1902 to separate the dielectric structure 1902 from the ESL 1002, the dielectric layer 1004, the ESL 1802, the ILD layer 1804, the dielectric layer 802, and the isolation structure 202, as shown in FIG. 20D.

The material of the dielectric structure 1902 may be single dielectric layer or multiple layers and selected from a group consisting of $Si_3N_4$, oxide, SiOC, SiON, SiOCN, carbon content oxide, nitrogen content oxide, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, high K material (K>=9), or combinations thereof. The barrier layers 1904 include a material that is different than the dielectric structure 1902. The barrier layers 1904 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods.

Referring to FIGS. 21A to 21D, an ESL 2002, an ILD layer 2004, and a hard mask layer 2006 are formed over the workpiece 100. The ESL 2002 is first conformally formed on top surfaces of the gate structures 1202 (the gate dielectric layers 1204 and the gate electrodes 1206), the gate spacers 402, the ESL 1802, and the ILD layer 1804. After the formation of the ESL 2002, the ILD layer 2004 is formed over the ESL 1802 and the hard mask layer 2006 is then formed the ILD layer 2004. Subsequent to the formation of the ESL 2002, the ILD layer 2004, and the hard mask layer 2006, one or more lithography and etching processes are performed to pattern and recess portions of the ESL 2002, the ILD layer 2004, the hard mask layer 2006, the ESL 1802, and the ILD layer 1804, thereby forming contact openings 2008 passing through the ESL 2002, the ILD layer 2004, the hard mask layer 2006, the ESL 1802, and the ILD layer 1804. In some embodiments, portions of the silicide features 1502 and 1702 are also etched and recessed during the formation of the contact openings 2008, thereby the silicide features 1502 and 1702 each has a concave top surface. Therefore, the contact openings 2008 expose the concave top surfaces of the silicide features 1502 and 1702, as shown in FIGS. 21A to 21D.

The ESL 2002 includes a material that is different than the ILD layer 2004. The ESL 2002 may include La$_2$O$_3$, Al$_2$O$_3$, SiOCN, SiOC, SiCN, SiO$_2$, SiC, ZnO, ZrN, Zr$_2$Al$_3$O$_9$, TiO$_2$, TaO$_2$, ZrO$_2$, HfO$_2$, Si$_3$N$_4$, Y$_2$O$_3$, AlON, TaCN, ZrSi, or other suitable material(s); and may be formed by CVD, PVD, ALD, or other suitable methods. In some embodiments, a material of the ILD layer 2004 is the same as the material of the ILD layer 2004. In other embodiments, the ILD layer 2004 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 2004 may be formed by PECVD (plasma enhanced CVD), FCVD (flowable CVD), or other suitable methods. The hard mask layer 2006 may be a single layer or a multi-layer. In some embodiments, the hard mask layer 2006 is a single layer and includes a nitride layer, such as silicon nitride. In some embodiments, the hard mask layer 2006 is a multi-layer and includes a silicon nitride layer and a silicon oxide layer over the silicon nitride layer. In some embodiments, the deposition process for forming the dielectric material of the hard mask layer 2006 includes CVD, LPCVD, plasma-enhanced CVD (PECVD), a combination thereof, or the like, may also be utilized.

Figure 22A:
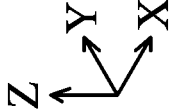
Figures 22B, 22C:
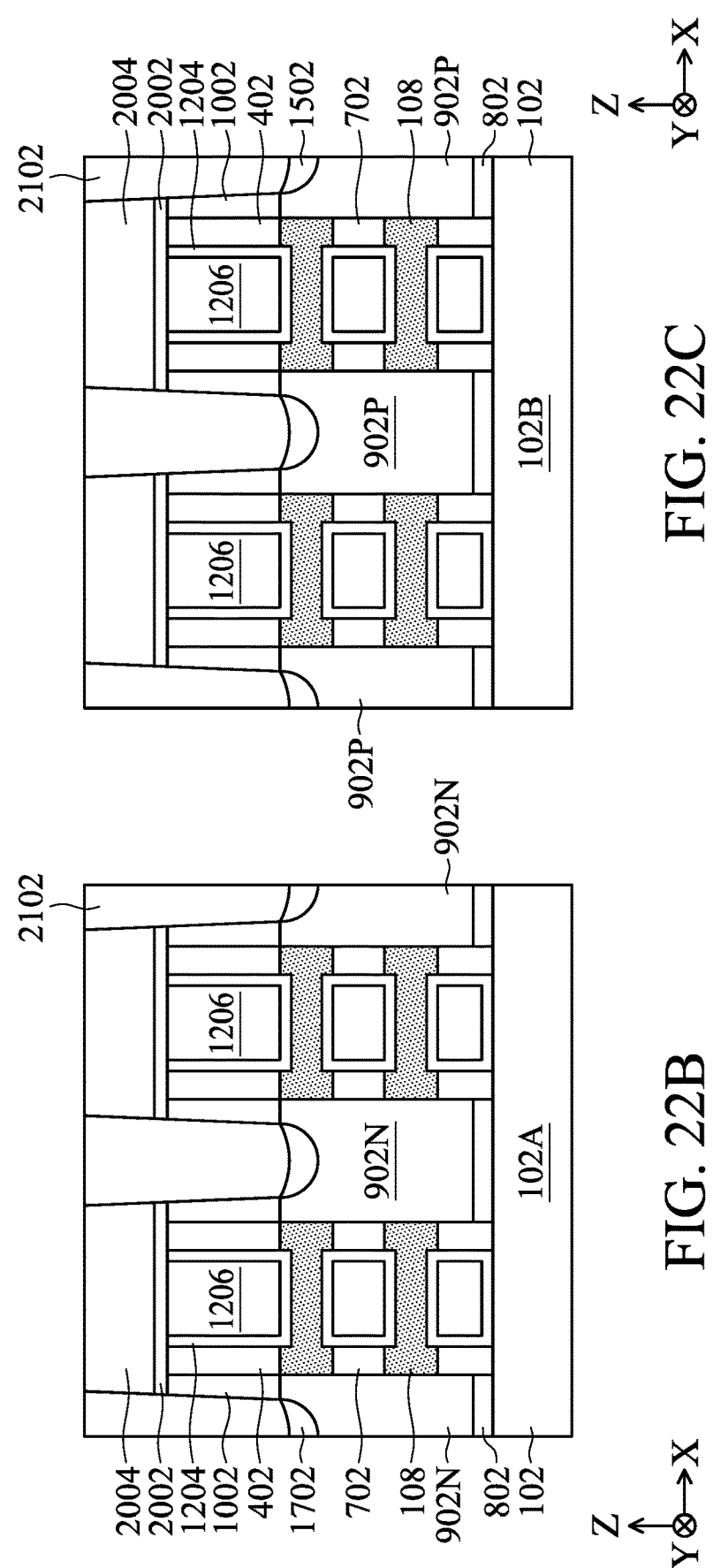

Referring to FIGS. 22A to 22D, source/drain contacts 2102 are formed in the contact openings 2008 and over the silicide features 1502 and 1702. More specifically, a conductive material is form in the contact openings 2008, and one or more CMP processes are then performed to remove the hard mask layer 2006, portions of the conductive material, and portions of the ILD layer 2004, thereby the remaining conductive material in the contact openings 2008 forms the source/drain contacts 2102 passing through the ILD layer 1804, the ESL 2002, and the ILD layer 2004. The source/drain contacts 2102 are electrically connected to and in contact with the silicide features 1502 and 1702. Further, the source/drain contacts 2102 each has a convex bottom surface due to the concave top surfaces of the silicide features 1502 and 1702, as shown in FIGS. 22B and 22C. In other words, the convex bottom surfaces of the source/drain contacts 2102 are complementary to and in contact with the concave top surfaces of the silicide features 1502 and 1702. In some embodiments, a height of the source/drain contacts 2102 is in a range from about 20 nm to about 25 nm.

In some embodiments, after the formation of the source/drain contacts 2102, the remaining ESL 1802 is in contact with (sloped) sidewalls (or the extending arms 1502a and 1702a) of the silicide features 1502 and 1702, as shown in FIG. 22D. Furthermore, topmost surfaces of the ESL 1802 are higher than bottom surfaces of the source/drain contacts 2102, as shown in FIG. 22D. In some aspects, the topmost surfaces of the ESL 1802 are higher than top surfaces of the silicide features 1502 and 1702. In some embodiments, a length L1 of the silicide features 1502 and 1702 in the Y-direction is greater than a length L2 of the source/drain contacts 2102 in the Y-direction, as shown in FIG. 22D.

The conductive material of the source/drain contacts 2102 may include Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 2102 may each include single conductive material layer or multiple conductive layers.

It should be noted that the source/drain contacts 2102 are in contact with the ILD layer 1804, the ESL 2002, and the ILD layer 2004 without barrier layers separating the source/drain contacts 2102 from the ILD layer 1804, the ESL 2002, and the ILD layer 2004. This is because that the silicide features 1502 and 1702 are formed before the formation of the contact openings 2008 for the source/drain contacts 2102. In other words, the silicide features 1502 and 1702 are not formed through the contact openings 2008. As such, the contact areas between the source/drain contacts 2102 and the silicide features 1502/1702 are greater than existing technology, thereby having smaller contact resistances and improving the performance of the resultant transistors or devices. In some embodiments, a height of the dielectric layer 1004 is in a range from about 20 nm to about 25 nm.

FIG. 23 is a Y-Z cross-sectional view of the portion of the workpiece along the line C-C' of FIG. 22A, in accordance with some embodiments of the present disclosure. Referring back to FIGS. 22A to 22D, the ILD layer 1804 covers the silicide features 1502 and 1702 and the dielectric layer 1004. More specifically, the silicide features 1502 and 1702 are partially covered by the ILD layer 1804. Further, the ILD layer 1804 is separated from the silicide features 1502 and 1702 by the ESL 1802. Referring to FIG. 23, the ESL 1802 discussed above is omitted, and the ILD layer 1804 is directly formed over and in direct contact with the ESL 1002, the dielectric layer 1004, the source/drain features 902N and 902P, and the silicide features 1502 and 1702. In some embodiments, the ILD layer 1804 is direct contact with the (sloped) sidewalls (or the extending arms 1502a and 1702a) of the silicide features 1502 and 1702. In other embodiments, the ILD layer 1804 is direct contact with the (sloped) sidewalls of the lower half portions of the source/drain features 902N and 902P, as shown in FIG. 23.

The embodiments disclosed herein relate to semiconductor structures and their manufacturing methods, and more particularly to methods and semiconductor structures including silicide features having different compositions for n-type and p-type source/drain features. Furthermore, the present embodiments provide one or more of the following advantages. The silicide features are formed before the formation of contact openings for source/drain contacts to increase the process window and contact area, thereby reducing or decreasing resistance.

Thus, one of the embodiments of the present disclosure describes a method for manufacturing a semiconductor structure that includes forming a first fin and a second fin extending in an X-direction and over a substrate in a Z-direction. The first fin and the second fin individually includes first semiconductor layers and second semiconductor layers alternating stacked. The method further includes forming a dummy gate structure extending in a Y-direction and over the first fin and the second fin, forming first source/drain features on opposite sides of the dummy gate structures in the X-direction and over the first fin, forming second source/drain features on opposite sides of the dummy gate structures in the X-direction and over the second fin, forming a dielectric layer over and between the first source/drain features and the second source/drain features, replacing the dummy gate structure and the first semiconductor layers with a gate structure wrapping around the second semiconductor layers, recessing the dielectric layer over the first source/drain features to exposed the first source/drain features, forming first silicide features over the first source/drain features, recessing the dielectric layer over the second source/drain features to expose the second source/drain features, forming second silicide features over the second source/drain features, and forming an interlayer dielectric layer over the dielectric layer, the first silicide features, and the second silicide features.

In some embodiments, a first composition of the first silicide features is different from a second composition of the second silicide features.

In some embodiments, the method further includes forming an etching stop layer over the first source/drain features and the second source/drain features before the formation of the dielectric layer. The etching stop layer is in contact with sidewalls of lower half portions of the first source/drain features and the second source/drain features.

In some embodiments, a dielectric material of the interlayer dielectric layer is different from a dielectric material of the dielectric layer.

In some embodiments, the method further includes forming an etching stop layer over the dielectric layer, the first silicide features, and the second silicide features before the formation of the interlayer dielectric layer.

In some embodiments, the method further includes forming source/drain contacts over and electrically connected to the first silicide features and the second silicide features. The source/drain contacts are in direct contact with the interlayer dielectric layer.

In some embodiments, a width of the first silicide features and the second silicide features in the X-direction is in a range from about 5 nm to about 30 nm.

In some embodiments, each of the first silicide features and the second silicide features in a Y-Z cross-sectional view has a stool-like shape.

In some embodiments, the first silicide features and the second silicide features wrap around upper half portions of the first source/drain features and the second source/drain features.

In another of the embodiments, discussed is a method for manufacturing a semiconductor structure including forming a first fin and a second fin over a substrate. The first fin and the second fin individually comprise first semiconductor layers and second semiconductor layers alternating stacked. The method further includes recessing portions of the first fin and the second fin to form a first source/drain trench exposing sidewalls of the second semiconductor layers of the first fin and a second source/drain trench exposing sidewalls of the second semiconductor layers of the second fin, forming a first source/drain feature in the first source/drain trench and a second source/drain feature in the second source/drain trench, coating a dielectric layer covering the first source/drain feature and the second source/drain feature, recessing first portions of the dielectric layer to expose the first source/drain features, forming a first silicide feature over the first source/drain feature in the first trench, recessing second portions of the dielectric layer to expose the second source/drain feature, forming a second silicide feature over the second source/drain feature, forming an interlayer dielectric layer covering the dielectric layer, the first silicide feature, and the second silicide feature, and forming source/drain contacts through the interlayer dielectric layer and in contact with the first silicide feature and the second silicide feature.

In some embodiments, the method further includes removing the first semiconductor layers to form a gate trench exposing the second semiconductor layers, forming a gate structure in the gate trench and wrapping around the first semiconductor layers, and forming an oxide layer covering the first silicide feature before the recessing of the dielectric layer over the second source/drain features.

In some embodiments, the method further includes recessing portions of the interlayer dielectric layer, first silicide feature, and the second silicide feature to expose concave top surfaces of the first silicide feature and the second silicide feature.

In some embodiments, each of the first silicide feature and the second silicide feature has extending arms in contact with sidewalls of upper half portions of the first source/drain feature and the second source/drain feature.

In some embodiments, the interlayer dielectric layer includes SiOCN and the dielectric layer includes SiOC.

In some embodiments, the first silicide feature includes Sb, Zr, or Y and the second silicide feature includes Mo, Ni, or Ru.

In yet another of the embodiments, discussed is a semiconductor structure that includes a substrate, first nanostructures, second nanostructures, a gate structure, first source/drain features, second source/drain features, a dielectric layer, first silicide features, second silicide features, an interlayer dielectric layer, and source/drain contacts. The first nanostructures are over the substrate and spaced apart from each other in a Z-direction. The second nanostructures are over the substrate and spaced apart from each other in the Z-direction. The gate structure extends in a Y-direction and wraps around the first nanostructures and the second nanostructures. The first source/drain features are attached to the first nanostructures in an X-direction. The second source/drain features are attached to the second nanostructures in the X-direction. The dielectric layer is between the first source/drain features and the second source/drain features in the Y-direction. The first silicide features include a first material and are over the first source/drain feature. The second silicide features include a second material and are over the second source/drain features. The second material is different from the first material. The interlayer dielectric layer is over the dielectric layer. The first silicide features and the second silicide features are partially covered by the interlayer dielectric layer. The source/drain contacts pass through the interlayer dielectric layer and are in contact with the first silicide feature and the second silicide feature.

In some embodiments, the first source/drain features and the second source/drain features respectively have a concave top surface in contact with the first silicide features and the second silicide features.

In some embodiments, a length of the first silicide features and the second silicide features in the Y-direction is greater than a length of the source/drain contacts in the Y-direction.

In some embodiments, a top surface of the dielectric layer is lower than bottommost surfaces of the first silicide features and the second silicide features.

In some embodiments, the semiconductor structure further includes an etching stop layer over and in contact with the dielectric layer, the first silicide features, and the second silicide features. Topmost surfaces of the etching stop layer are higher than top surfaces of the first silicide features and the second silicide features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a first fin and a second fin extending in an X-direction and over a substrate in a Z-direction, wherein first fin and the second fin individually comprises first semiconductor layers and second semiconductor layers alternating stacked;

forming a dummy gate structure extending in a Y-direction and over the first fin and the second fin;

forming first source/drain features on opposite sides of the dummy gate structures in the X-direction and over the first fin;

forming second source/drain features on opposite sides of the dummy gate structures in the X-direction and over the second fin;

forming a dielectric layer over and between the first source/drain features and the second source/drain features;

replacing the dummy gate structure and the first semiconductor layers with a gate structure wrapping around the second semiconductor layers;

recessing the dielectric layer over the first source/drain features to exposed the first source/drain features;

forming first silicide features over the first source/drain features;

recessing the dielectric layer over the second source/drain features to expose the second source/drain features;

forming second silicide features over the second source/drain features; and forming an interlayer dielectric layer over the dielectric layer, the first silicide features, and the second silicide features.

2. The method of claim 1, wherein a first composition of the first silicide features is different from a second composition of the second silicide features.

3. The method of claim 1, further comprising:

forming an etching stop layer over the first source/drain features and the second source/drain features before the formation of the dielectric layer, wherein the etching stop layer is in contact with sidewalls of lower half portions of the first source/drain features and the second source/drain features.

4. The method of claim 1, wherein a dielectric material of the interlayer dielectric layer is different from a dielectric material of the dielectric layer.

5. The method of claim 4, further comprising:

forming an etching stop layer over the dielectric layer, the first silicide features, and the second silicide features before the formation of the interlayer dielectric layer.

6. The method of claim 4, further comprising:

forming source/drain contacts over and electrically connected to the first silicide features and the second silicide features, wherein the source/drain contacts are in direct contact with the interlayer dielectric layer.

7. The method of claim 1, wherein a width of the first silicide features and the second silicide features in the X-direction is in a range from about 5 nm to about 30 nm.

8. The method of claim 1, wherein each of the first silicide features and the second silicide features in a Y-Z cross-sectional view has a stool-like shape.

9. The method of claim 1, wherein the first silicide features and the second silicide features wrap around upper half portions of the first source/drain features and the second source/drain features.

10. A method for manufacturing a semiconductor structure, comprising:

forming a first fin and a second fin over a substrate, wherein the first fin and the second fin individually comprise first semiconductor layers and second semiconductor layers alternating stacked;

recessing portions of the first fin and the second fin to form a first source/drain trench exposing sidewalls of the second semiconductor layers of the first fin and a second source/drain trench exposing sidewalls of the second semiconductor layers of the second fin;

forming a first source/drain feature in the first source/drain trench and a second source/drain feature in the second source/drain trench;

coating a dielectric layer covering the first source/drain feature and the second source/drain feature;

recessing first portions of the dielectric layer to expose the first source/drain features;

forming a first silicide feature over the first source/drain feature in the first trench;

recessing second portions of the dielectric layer to expose the second source/drain feature;

forming a second silicide feature over the second source/drain feature;

forming an interlayer dielectric layer covering the dielectric layer, the first silicide feature, and the second silicide feature; and forming source/drain contacts through the interlayer dielectric layer and in contact with the first silicide feature and the second silicide feature.

11. The method of claim 10, further comprising:

removing the first semiconductor layers to form a gate trench exposing the second semiconductor layers;

forming a gate structure in the gate trench and wrapping around the second semiconductor layers; and forming an oxide layer covering the first silicide feature before the recessing of the dielectric layer over the second source/drain feature.

12. The method of claim 10, further comprising:

recessing portions of the interlayer dielectric layer, first silicide feature, and the second silicide feature to expose concave top surfaces of the first silicide feature and the second silicide feature.

13. The method of claim 10, wherein each of the first silicide feature and the second silicide feature has extending arms in contact with sidewalls of upper half portions of the first source/drain feature and the second source/drain feature.

14. The method of claim 10, wherein the interlayer dielectric layer includes SiOCN and the dielectric layer includes SiOC.

15. The method of claim 10, wherein the first silicide feature includes Sb, Zr, or Y and the second silicide feature includes Mo, Ni, or Ru.

16. A semiconductor structure, comprising:

a substrate;

first nanostructures over the substrate and spaced apart from each other in a Z-direction;

second nanostructures over the substrate and spaced apart from each other in the Z-direction;

a gate structure extending in a Y-direction and wrapping around the first nanostructures and the second nano-structures;

first source/drain features attached to the first nanostructures in an X-direction;

second source/drain features attached to the second nano-structures in the X-direction;

a dielectric layer between the first source/drain features and the second source/drain features in the Y-direction;

first silicide features including a first material and over the first source/drain features;

second silicide features including a second material and over the second source/drain features, wherein the second material is different from the first material;

an interlayer dielectric layer over the dielectric layer, wherein the first silicide features and the second silicide features are partially covered by the interlayer dielec-tric layer; and source/drain contacts passing through the interlayer dielectric layer and in contact with the first silicide features and the second silicide features.

17. The semiconductor structure of claim 16, wherein the first source/drain features and the second source/drain fea-tures respectively have a concave top surface in contact with the first silicide features and the second silicide features.

18. The semiconductor structure of claim 16, wherein a length of the first silicide features and the second silicide features in the Y-direction is greater than a length of the source/drain contacts in the Y-direction.

19. The semiconductor structure of claim 16, wherein a top surface of the dielectric layer is lower than bottommost surfaces of the first silicide features and the second silicide features.

20. The semiconductor structure of claim 16, further comprising:

an etching stop layer over and in contact with the dielec-tric layer, the first silicide features, and the second silicide features, wherein topmost surfaces of the etch-ing stop layer are higher than top surfaces of the first silicide features and the second silicide features.

* * * * *